(12) United States Patent
Kimoto et al.

(10) Patent No.: US 11,121,270 B2
(45) Date of Patent: *Sep. 14, 2021

(54) PHOTOELECTRIC CONVERSION ELEMENT, PHOTOELECTRIC CONVERSION MODULE, AND SOLAR PHOTOVOLTAIC POWER GENERATION SYSTEM

(71) Applicant: SHARP KABUSHIKI KAISHA, Osaka (JP)

(72) Inventors: Kenji Kimoto, Osaka (JP); Naoki Koide, Osaka (JP); Takeshi Hieda, Osaka (JP); Junichi Nakamura, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 131 days.

This patent is subject to a terminal disclaimer.

(21) Appl. No.: 15/031,823

(22) PCT Filed: Oct. 24, 2014

(86) PCT No.: PCT/JP2014/078372
§ 371 (c)(1),
(2) Date: Apr. 25, 2016

(87) PCT Pub. No.: WO2015/060434
PCT Pub. Date: Apr. 30, 2015

(65) Prior Publication Data
US 2016/0247949 A1    Aug. 25, 2016

Related U.S. Application Data

(63) Continuation of application No. PCT/JP2014/078372, filed on Oct. 24, 2014.

(30) Foreign Application Priority Data

Oct. 24, 2014    (JP) .............................. JP2013-222816

(51) Int. Cl.
*H01L 31/0224* (2006.01)
*H01L 31/0747* (2012.01)
(Continued)

(52) U.S. Cl.
CPC ............... *H01L 31/022441* (2013.01); *H01L 31/02167* (2013.01); *H01L 31/022425* (2013.01);
(Continued)

(58) Field of Classification Search
CPC ......... H01L 31/022441; H01L 31/0516; H01L 31/0682; H01L 31/022466; H01L 31/18; H01L 31/1884
See application file for complete search history.

(56) References Cited

U.S. PATENT DOCUMENTS

| 2005/0062041 A1* | 3/2005 | Terakawa | H01L 31/0747 |
| | | | 257/53 |
| 2007/0169808 A1* | 7/2007 | Kherani | H01L 31/0747 |
| | | | 136/258 |

(Continued)

FOREIGN PATENT DOCUMENTS

| CN | 101694835 A | 4/2010 |
| CN | 102971859 A | 3/2013 |

(Continued)

OTHER PUBLICATIONS

T. Mishima et al., "Development status of high-efficiency HIT solar cells", *Solar Energy Materials and Solar Cells*, vol. 95, Issue 1, Jan. 2011, pp. 18-21.

(Continued)

*Primary Examiner* — Mayla Gonzalez Ramos
(74) *Attorney, Agent, or Firm* — ScienBiziP, P.C.

(57) ABSTRACT

There is provided a photoelectric conversion element which can prevent the contact resistance between a non-crystalline semiconductor layer containing impurities and an electrode formed on the non-crystalline semiconductor layer from increasing, and can improve the element characteristics. A photoelectric conversion element (10) includes a semiconductor substrate (12), a first semiconductor layer (20n), a second semiconductor layer (20p), a first electrode (22n), and a second electrode (22p). The first semiconductor layer (20n) has a first conductive type. The second semiconductor layer (20p) has a second conductive type opposite to the first conductive type. The first electrode (22n) is formed on the first semiconductor layer (20n). The second electrode (22p) is formed on the second semiconductor layer (20p). At least one electrode of the first electrode (22n) and the second electrode (22p) includes a plurality of metal crystal grains. The average crystal grain size of the metal crystal grains in the in-surface direction of electrode is greater than the thickness of the electrode.

10 Claims, 18 Drawing Sheets

(51) Int. Cl.
  H01L 31/0216    (2014.01)
  H01L 31/0376    (2006.01)
  H01L 31/068     (2012.01)
  H02S 10/00      (2014.01)

(52) U.S. Cl.
  CPC ...... *H01L 31/03762* (2013.01); *H01L 31/068* (2013.01); *H01L 31/0747* (2013.01); *H02S 10/00* (2013.01); *Y02E 10/547* (2013.01)

(56) References Cited

U.S. PATENT DOCUMENTS

| | | | |
|---|---|---|---|
| 2009/0289320 A1* | 11/2009 | Cohen | B82Y 10/00 |
| | | | 257/458 |
| 2010/0193027 A1 | 8/2010 | Ji et al. | |
| 2010/0224245 A1* | 9/2010 | Bartholomeusz | H01L 31/068 |
| | | | 136/256 |
| 2011/0049541 A1* | 3/2011 | Katsuno | H01L 33/405 |
| | | | 257/94 |
| 2012/0042945 A1* | 2/2012 | Ji | H01L 31/0682 |
| | | | 136/256 |
| 2013/0037102 A1 | 2/2013 | Isaka | |
| 2014/0090701 A1* | 4/2014 | Rim | H01L 31/1804 |
| | | | 136/256 |

FOREIGN PATENT DOCUMENTS

| | | |
|---|---|---|
| JP | 2005-101240 | 4/2005 |
| JP | 2007-281156 | 10/2007 |
| JP | 2010-183080 | 8/2010 |
| JP | 2013-098241 | 5/2013 |
| JP | 2013098241 A * | 5/2013 |

OTHER PUBLICATIONS

International Search Report for PCT/JP2014/078372 dated Nov. 25, 2014, one (1) page.

* cited by examiner n-type amorphous silicon layer 20n    electrode 22n n-type amorphous silicon layer 20n    electrode 22n //cumsum
PHOTOELECTRIC CONVERSION ELEMENT, PHOTOELECTRIC CONVERSION MODULE, AND SOLAR PHOTOVOLTAIC POWER GENERATION SYSTEM This application is the U.S. national phase of International Application No. PCT/JP2014/078372 filed 24 Oct. 2014 which designated the U.S. and claims priority to JP Patent Application No. 2013-222816 filed 25 Oct. 2013, the entire contents of each of which are hereby incorporated by reference.

TECHNICAL FIELD

The present invention relates to a photoelectric conversion element, a photoelectric conversion module, and a solar photovoltaic power generation system.

BACKGROUND ART

In recent years, a solar battery which serves as a photoelectric conversion element has drawn attention. An example of the solar battery is a rear surface electrode type solar battery.

The rear surface electrode type solar battery is disclosed in Japanese Unexamined Patent Application Publication No. 2007-281156. In the related art, the rear surface electrode type solar battery includes a crystalline semiconductor; an n-type non-crystalline semiconductor layer which is formed on a rear surface which is opposite to an irradiation surface of sunlight, in the crystalline semiconductor; a p-type non-crystalline semiconductor layer which is formed on the rear surface; and electrodes which are formed on the n-type non-crystalline semiconductor layer and the p-type non-crystalline semiconductor layer.

However, as described in the related art, in a case where the electrodes are formed on the non-crystalline semiconductor layers, there is a problem that the contact resistance between the non-crystalline semiconductor layer and the electrode increases.

SUMMARY OF INVENTION

An object of the present invention is to provide a photoelectric conversion element which can reduce the contact resistance between a non-crystalline semiconductor layer containing impurities and an electrode formed on the non-crystalline semiconductor layer, and can improve the element characteristics.

A photoelectric conversion element according to an aspect of the present invention includes: a semiconductor substrate, a first semiconductor layer, a second semiconductor layer, a first electrode, and a second electrode. The first semiconductor layer has a first conductive type. The second semiconductor layer has a second conductive type opposite to the first conductive type. The first electrode is formed on the first semiconductor layer. The second electrode is formed on the second semiconductor layer. At least one electrode of the first electrode and the second electrode includes a plurality of metal crystal grains. The average crystal grain size of the metal crystal grain in the in-surface direction of the electrode is greater than the thickness of the electrode.

The photoelectric conversion element according to the aspect of the present invention can prevent the contact resistance between the non-crystalline semiconductor layer containing impurities and the electrode formed on the non-crystalline silicon layer from increasing, and can improve the element characteristics.

DESCRIPTION OF EMBODIMENTS

Figure 1:
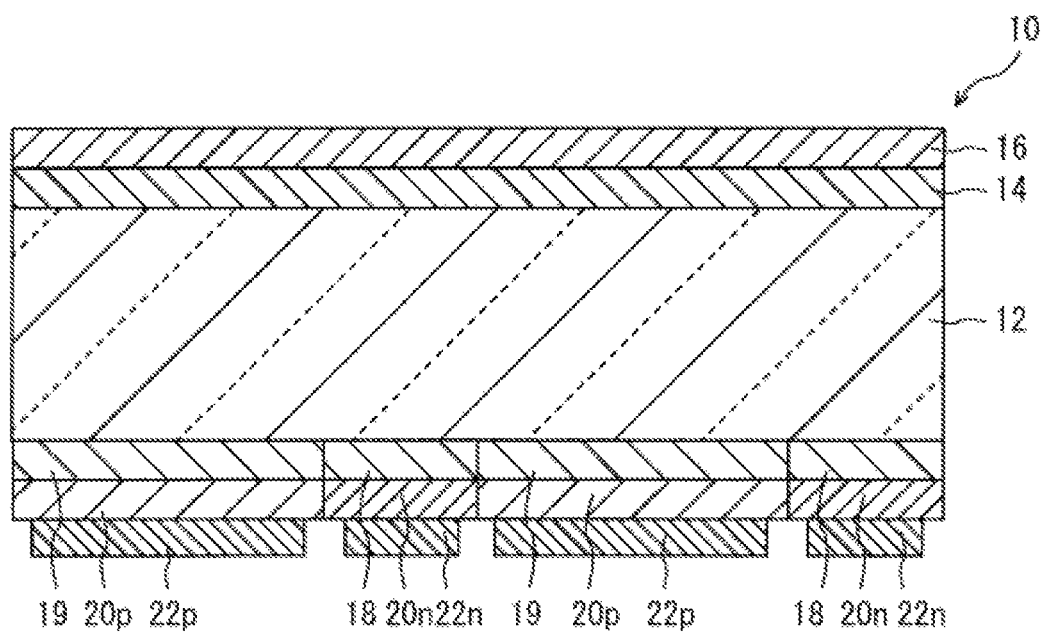
FIG. 1 is a sectional view illustrating a schematic configuration of a photoelectric conversion element according to a first embodiment of the present invention.

A photoelectric conversion element according to a first aspect of the present invention includes a semiconductor substrate, a first semiconductor layer, a second semiconductor layer, a first electrode, and a second electrode. The first semiconductor layer has a first conductive type. The second semiconductor layer has a second conductive type opposite to the first conductive type. The first electrode is formed on the first semiconductor layer. The second electrode is formed on the second semiconductor layer. At least one electrode out of the first electrode and the second electrode includes a plurality of metal crystal grains. The average crystal grain size of the metal crystal grain in the in-surface direction of the electrode is greater than the thickness of the electrode.

In the first aspect, it is possible to reduce the contact resistance between the electrode and the semiconductor layer. As a result, it is possible to improve the characteristics of the photoelectric conversion element.

In the photoelectric conversion element according to a second aspect of the present invention, in the photoelectric conversion element according to the first aspect, the electrode is made of a metal film which has silver as a main component.

In the second aspect, it is possible to reduce the resistance of the electrode. In addition, in a case where the electrode is formed on the rear surface opposite to a light-incident side of the semiconductor substrate, by effectively reflecting light reaching the rear surface, conversion efficiency is improved.

In the photoelectric conversion element according to a third aspect of the present invention, in the photoelectric conversion element according to the first or second aspect, the first semiconductor layer and the second semiconductor layer are provided on a rear surface opposite to a light-receiving surface on the semiconductor substrate.

In the third aspect, in the rear surface electrode type photoelectric conversion element, it is possible to improve the element characteristics.

In the photoelectric conversion element according to a fourth aspect of the present invention, in the photoelectric conversion element according to any of the first to third aspects, in the metal crystal grains, a crystal axis which is parallel to the thickness direction of the semiconductor substrate is preferentially oriented in the <111> direction.

In the fourth aspect, it is possible to prevent the contact resistance between the electrode and the semiconductor layer from increasing.

In the photoelectric conversion element according to a fifth aspect of the present invention, in the photoelectric conversion element according to any of the first to fourth aspects, the electrode is the first electrode. The first conductive type is an n-type. The average crystal grain size is 1.34 times or greater than the thickness of the first electrode.

In the fifth aspect, it is possible to prevent the contact resistance between the first electrode and the first semiconductor layer from increasing.

In the photoelectric conversion element according to a sixth aspect of the present invention, in the photoelectric conversion element according to any of the first to fourth aspects, the electrode is the first electrode. The first conductive type is the n-type. The average crystal grain size is 1.54 times or greater than the thickness of the first electrode.

In the sixth aspect, it is possible to further prevent the contact resistance between the first electrode and the first semiconductor layer from increasing.

In the photoelectric conversion element according to a seventh aspect of the present invention, in the photoelectric conversion element according to any of the first to fourth aspects, the electrode is the second electrode. The second conductive type is a p-type. The average crystal grain size is greater than 1 times and 2.44 times or less than the thickness of the second electrode.

In the seventh aspect, it is possible to prevent the contact resistance between the second electrode and the second semiconductor layer from increasing.

In the photoelectric conversion element according to an eighth aspect of the present invention, in the photoelectric conversion element according to any of the first to fourth aspects, the electrode is the second electrode. The second conductive type is the p-type. The average crystal grain size is 1.26 times or greater and 2.44 times or less than the thickness of the second electrode.

In the eighth aspect, it is possible to further prevent the contact resistance between the second electrode and the second semiconductor layer from increasing.

In the photoelectric conversion element according to a ninth aspect of the present invention, in the photoelectric conversion element according to any of the first to fourth aspects, the semiconductor substrate conductive type is the first conductive type. A contact area between the second electrode and the second semiconductor layer is 2 times or greater than a contact area between the first electrode and the first semiconductor layer. The electrode is the first electrode and the second electrode. An average value of the average crystal grain size of the first electrode and the average crystal grain size of the second electrode is 1.3 times or greater and 4.72 times or less than the thickness of the first electrode and the second electrode.

In the ninth aspect, it is possible to improve the element characteristics.

In the photoelectric conversion element according to a tenth aspect of the present invention, in the photoelectric conversion element according to any of the first to fourth aspects, the semiconductor substrate conductive type is the first conductive type. The contact area between the second electrode and the second semiconductor layer is 1 times or greater than the contact area between the first electrode and the first semiconductor layer. The electrode is the first electrode and the second electrode. An average value of the average crystal grain size of the first electrode and the average crystal grain size of the second electrode is 1.3 times or greater and 4 times or less than the thickness of the first electrode and the second electrode.

In the tenth aspect, it is possible to further improve the element characteristics.

In the photoelectric conversion element according to an eleventh aspect of the present invention, in the photoelectric conversion element according to the first aspect, the first semiconductor layer is formed on the semiconductor substrate, and includes a first conductive type non-crystalline semiconductor. Between the semiconductor substrate and the first semiconductor layer, a third semiconductor layer including an intrinsic non-crystalline semiconductor is formed.

In the eleventh aspect, compared to a case where the first semiconductor layer is formed directly on the semiconductor substrate, the passivation characteristics of the semiconductor substrate is improved.

In the photoelectric conversion element according to a twelfth aspect of the present invention, in the photoelectric conversion element according to the eleventh aspect, the intrinsic non-crystalline semiconductor is hydrogenated amorphous silicon.

In the twelfth aspect, the passivation characteristics of the rear surface of the semiconductor substrate is further improved.

In the photoelectric conversion element according to a thirteenth aspect of the present invention, in the photoelectric conversion element according to the eleventh aspect, the first conductive type non-crystalline semiconductor is hydrogenated amorphous silicon.

In the thirteenth aspect, it is possible to suppress deterioration of contact interface between the first electrode and the first semiconductor layer.

In the photoelectric conversion element according to a fourteenth aspect of the present invention, in the photoelectric conversion element according to the first aspect, the second semiconductor layer is formed on the semiconductor substrate, and includes the second conductive type non-crystalline semiconductor. A fourth semiconductor layer including the intrinsic non-crystalline semiconductor is formed between the semiconductor substrate and the second semiconductor layer.

In the fourteenth aspect, compared to a case where the second semiconductor layer is formed directly on the semiconductor substrate, the passivation characteristics of the semiconductor substrate are improved.

In the photoelectric conversion element according to a fifteenth aspect of the present invention, in the photoelectric conversion element according to the fourteenth aspect, the intrinsic non-crystalline semiconductor is hydrogenated amorphous silicon.

In the fifteenth aspect, the passivation characteristics of the semiconductor substrate are further improved.

In the photoelectric conversion element according to a sixteenth aspect of the present invention, in the photoelectric conversion element according to the fourteenth aspect, the second conductive type non-crystalline semiconductor is hydrogenated amorphous silicon.

In the sixteenth aspect, it is possible to suppress deterioration of the contact area between the second electrode and the second semiconductor layer.

A photoelectric conversion module according to the first aspect of the present invention includes the photoelectric conversion element according to any of the first to sixteenth aspects of the present invention.

In the first aspect, it is possible to improve performance of the photoelectric conversion module.

A photoelectric conversion system according to the first aspect of the present invention includes the photoelectric conversion module according to the first aspect of the present invention.

In the first aspect, it is possible to improve performance of the photoelectric conversion system.

Hereinafter, more specific embodiments of the present invention will be described with reference to the drawings. The same parts or the same corresponding parts in the drawings will be given the same reference numerals, and the description thereof will not be repeated.

First Embodiment

FIG. 1 illustrates a photoelectric conversion element 10 according to a first embodiment of the present invention. The photoelectric conversion element 10 is the rear surface electrode type solar battery.

The photoelectric conversion element 10 includes a silicon substrate 12, a passivation film 14, a reflection preventing film 16, intrinsic non-crystalline silicon layers 18 and 19, an n-type non-crystalline silicon layer 20n, a p-type non-crystalline silicon layer 20p, an electrode 22n, and an electrode 22p.

The silicon substrate 12 is an n-type single crystal silicon substrate. The thickness of the silicon substrate 12 is, for example, 50 μm to 300 μm. The specific resistance of the silicon substrate 12 is, for example, 1.0 Ω·cm to 10.0 Ω·cm. In addition, instead of the n-type single crystal silicon substrate, an n-type polycrystal silicon substrate, an n-type single crystal germanium, or an n single crystal silicon germanium, may be used, and in general, the semiconductor substrate may be used. Instead of the n-type, the p-type may be used.

Although not illustrated, a texture structure is formed on the light-receiving surface of the silicon substrate 12. Accordingly, the light which is incident on the silicon substrate 12 is blocked up, and the use efficiency of the light can be improved.

It is preferable that the orientation of the silicon substrate 12 is (100). Accordingly, it becomes easy to form the texture structure.

The light-receiving surface of the silicon substrate 12 is covered with the passivation film 14. The passivation film 14 is, for example, a hydrogenated amorphous silicon film. The film thickness of the passivation film 14 is, for example, 3 nm to 30 nm. In addition, as the passivation film 14, instead of the hydrogenated amorphous silicon film, a silicon nitride film, a silicon oxide film, or a silicon oxynitride film, may be used.

The reflection preventing film 16 covers the passivation film 14. The reflection preventing film 16 is, for example, a silicon nitride film. The film thickness of the reflection preventing film 16 is, for example, 50 nm to 200 nm.

On the rear surface of the silicon substrate 12, the intrinsic non-crystalline silicon layers 18 and 19 are formed. The intrinsic non-crystalline silicon 18 and 19 are made of, for example, an i-type hydrogenated amorphous silicon (a-Si:H). The intrinsic non-crystalline silicon layer 18 is formed at a part of the rear surface of the silicon substrate 12. The intrinsic non-crystalline silicon layer 19 is formed to be adjacent to the intrinsic non-crystalline silicon layer 18 on the rear surface of the silicon substrate 12. In other words, the intrinsic non-crystalline silicon layers 18 and 19 are alternately formed on the entire rear surface of the silicon substrate 12. The thickness of the intrinsic non-crystalline silicon layers 18 and 19 is, for example, 10 nm. In the example illustrated in FIG. 1, the intrinsic non-crystalline silicon layer 19 is formed to be adjacent to the intrinsic non-crystalline silicon layer 18, but, for example, may be formed at a part of the region in which the intrinsic non-crystalline silicon layer 18 is not formed on the rear surface of the silicon substrate 12. In addition, the intrinsic non-crystalline silicon layers 18 and 19 may be made only of a non-crystalline phase, or may be made of a fine crystalline phase and a non-crystalline phase.

On the intrinsic non-crystalline silicon layer 18, the n-type non-crystalline silicon layer 20n is formed. The n-type non-crystalline silicon layer 20n is made of the hydrogenated amorphous silicon (a-Si:H(n)) containing n-type impurities (for example, phosphorus). The thickness of the n-type non-crystalline silicon layer 20n is, for example, 10 nm. The impurities concentration of the n-type non-crystalline silicon layer 20n is, for example, $1\times10^{19}$ $cm^{-3}$ to $1\times10^{21}$ $cm^{-3}$. The n-type non-crystalline silicon layer 20n may be made only of the non-crystalline phase, or may be made of the fine crystalline phase and the non-crystalline phase. An example of a case where the n-type non-crystalline silicon layer 20n is made of the fine crystalline phase and the non-crystalline phase, is, for example, an n-type microcrystalline silicon.

On the intrinsic non-crystalline silicon layer 19, the p-type non-crystalline silicon layer 20p is formed. The p-type non-crystalline silicon layer 20p is made of the hydrogenated amorphous silicon (a-Si:H(p)) containing p-type impurities (for example, boron). The thickness of the p-type non-crystalline silicon layer 20p is, for example, 10 nm. The impurities concentration of the p-type non-crystalline silicon layer 20p is, for example, $1\times10^{19}$ $cm^{-3}$ to $1\times10^{21}$ $cm^{-3}$. The p-type non-crystalline silicon layer 20p may be made only of the non-crystalline phase, or may be made of the fine crystalline phase and the non-crystalline phase. An example of a case where the p-type non-crystalline silicon layer 20p is made of the fine crystalline phase and the non-crystalline phase, is a p-type microcrystalline silicon. In the example illustrated in FIG. 1, the n-type non-crystalline silicon layer 20n is formed to be adjacent to the p-type non-crystalline silicon layer 20p, but it is not necessary to be adjacent to the p-type non-crystalline silicon layer 20p, and for example, the n-type non-crystalline silicon layer 20n may be formed at least at a part on the non-crystalline silicon layer 18, or the p-type non-crystalline silicon layer 20p may be formed at least at a part on the non-crystalline silicon layer 19.

In the in-surface direction of the silicon substrate 12, it is preferable that the width dimension of the n-type non-crystalline silicon layer 20n is less than the width dimension of the p-type non-crystalline silicon layer 20p. As a ratio of the area of the p-type non-crystalline silicon layer 20p with respect to the sum of the area of the n-type non-crystalline silicon layer 20n and the area of the p-type non-crystalline silicon layer 20p (area ratio of the p-type non-crystalline silicon layer 20p) increases, the distance by which the light-generated minority carrier (positive hole) should move to reach the p-type non-crystalline silicon layer $20p$ decreases. Therefore, the number of recombining positive holes until reaching the p-type non-crystalline silicon layer $20p$ decreases, and the short-circuit in photoelectric current increases. Therefore, a conversion ratio of the photoelectric conversion element 10 is improved. A preferable area ratio of the p-type non-crystalline silicon layer $20p$ is 63% to 90%.

Although not illustrated, the texture structure may be formed on the rear surface of the silicon substrate 12. In this case, in the intrinsic non-crystalline silicon layers 18 and 19, and the n-type non-crystalline silicon layer $20n$ and the p-type non-crystalline silicon layer $20p$, unevenness which corresponds to the texture structure of the rear surface of the silicon substrate 12 is formed.

On the n-type non-crystalline silicon layer $20n$, the electrode $22n$ is formed. On the p-type non-crystalline silicon layer $20p$, the electrode $22p$ is formed. The electrodes $22n$ and $22p$ are metal films which has silver as a main component. The electrodes $22n$ and $22p$ may contain element (for example, metal element or oxygen) other than silver. The thickness of the electrodes $22n$ and $22p$ is 500 nm.

In addition, in a case where the texture structure is formed on the rear surface of the silicon substrate 12, adhesiveness between the electrode $22n$ and the n-type non-crystalline silicon layer $20n$ and adhesiveness between the electrode $22p$ and the p-type non-crystalline silicon layer $20p$ are improved. Accordingly, yield and reliability of the photoelectric conversion element 10 are improved.

Furthermore, compared to a case where the rear surface of the silicon substrate 12 is flat, since the contact surface between the electrode $22n$ and the n-type non-crystalline silicon layer $20n$, and a contact area between the electrode $22p$ and the p-type non-crystalline silicon layer $20p$ become large, the contact resistance decreases. In addition, when viewed from the thickness direction of the silicon substrate 12, the texture may be formed in any one of a region including at least a part of the region overlapping the electrode $22n$, and a region including at least a part of the region overlapping the electrode $22p$.

[Manufacturing Method of Photoelectric Conversion Element]

With reference to FIGS. 2A to 2F, a manufacturing method of the photoelectric conversion element 10 will be described.

Figure 2A:
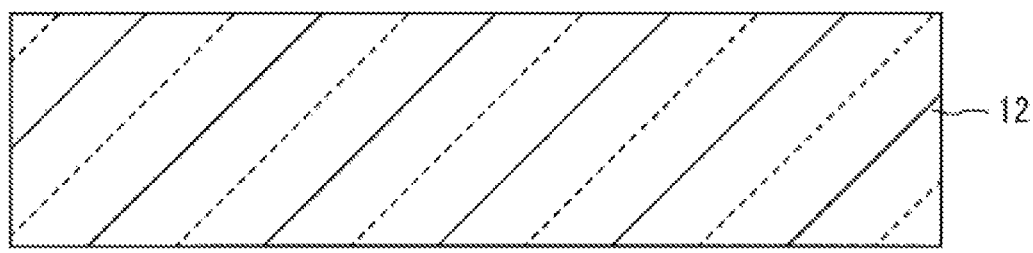
FIG. 2A is a sectional view illustrating a manufacturing method of the photoelectric conversion element illustrated in FIG. 1, and is a sectional view illustrating a silicon substrate.

First, as illustrated in FIG. 2A, the silicon substrate 12 is prepared. The silicon substrate 12 has the texture structure on the entire light-receiving surface. A method for forming the texture structure is, for example, wet etching. By performing the wet etching on the entire light-receiving surface of the silicon substrate 12, the texture structure is formed on the entire light-receiving surface of the silicon substrate 12. The wet etching is performed, for example, by using an alkaline solution. The time for the wet etching is, for example, 10 minutes to 60 minutes. The alkaline solution used in the wet etching is, for example, NaOH or KOH, and the concentration thereof is, for example, 5%.

Figure 2B:
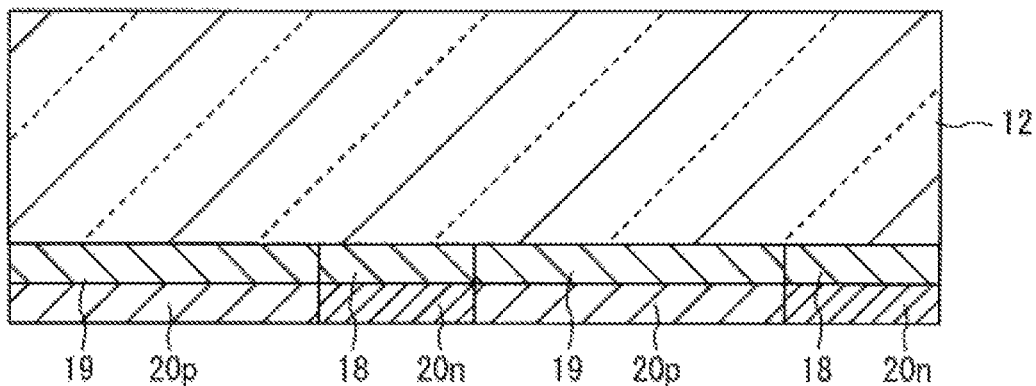
FIG. 2B is a sectional view illustrating the manufacturing method of the photoelectric conversion element illustrated in FIG. 1, and is a sectional view illustrating a state where an intrinsic non-crystalline silicon layer is formed on a rear surface of the silicon substrate and an n-type non-crystalline silicon layer and a p-type non-crystalline silicon layer are formed on the intrinsic non-crystalline silicon layer.

Next, as will be described in FIG. 2B, intrinsic non-crystalline silicon layers 18 and 19 are formed on the rear surface of the silicon substrate 12, the n-type non-crystalline semiconductor layer $20n$ is formed on the intrinsic non-crystalline semiconductor layer 18, and the p-type non-crystalline semiconductor layer $20p$ is formed on the intrinsic non-crystalline semiconductor layer 19.

The intrinsic non-crystalline silicon layers 18 and 19 can be formed, for example, by a plasma CVD. In a case where the intrinsic non-crystalline silicon layers 18 and 19 are formed by the plasma CVD, reaction gas which is led into a reaction chamber provided with a plasma CVD device, is silane gas and hydrogen gas. The temperature of the silicon substrate 12 is, for example, 100° C. to 300° C.

Next, the p-type non-crystalline silicon layer is formed on the intrinsic non-crystalline silicon layers 18 and 19. The p-type non-crystalline silicon layer can be formed, for example, by the plasma CVD. In a case where the p-type non-crystalline silicon layer is formed by the plasma CVD, the reaction gas which is led into the reaction chamber provided in the plasma CVD device, is silane gas, hydrogen gas, and diboran gas. The temperature of the silicon substrate 12 is, for example, 100° C. to 300° C.

Next, a coating layer which serves as a mask is formed on the p-type non-crystalline silicon layer. For example, the silicon nitride film formed on the p-type non-crystalline silicon layer is obtained by patterning. Instead of the silicon nitride film, a silicon oxide film or a silicon oxynitride may be used. The patterning is performed, for example, by a photolithography method. The coating layer covers a part which becomes the p-type non-crystalline silicon layer $20p$ later, that is, the p-type non-crystalline silicon layer formed on the intrinsic non-crystalline silicon layer 19, in the p-type non-crystalline silicon layer formed on the intrinsic non-crystalline silicon layers 18 and 19.

Next, the p-type non-crystalline silicon layer formed on the intrinsic non-crystalline silicon layer 18 is removed. A method of removing the p-type non-crystalline silicon layer may be dry etching, or may be wet etching. Accordingly, the p-type non-crystalline silicon layer $20p$ is formed on the intrinsic non-crystalline silicon layer 19. At this time, the coating layer is formed on the p-type non-crystalline silicon layer $20p$.

Next, the n-type non-crystalline silicon layer is formed on the intrinsic non-crystalline silicon layer 18, and on the coating layer formed on the p-type non-crystalline silicon layer $20p$. The n-type non-crystalline silicon layer can be formed by plasma CVD. In a case where the n-type non-crystalline silicon layer is formed by the plasma CVD, the reaction gas which is led into the reaction chamber provided in the plasma CVD device is silane gas, hydrogen gas, and phosphine gas. The temperature of the silicon substrate 12 is, for example, 100° C. to 300° C.

Next, the coating layer formed on the p-type non-crystalline silicon layer $20p$ is removed. Accordingly, the n-type non-crystalline silicon layer $20n$ is formed on the intrinsic non-crystalline silicon layer 18. A method of removing the coating layer formed on the p-type non-crystalline silicon layer $20p$ is, for example, wet etching.

Figure 2C:
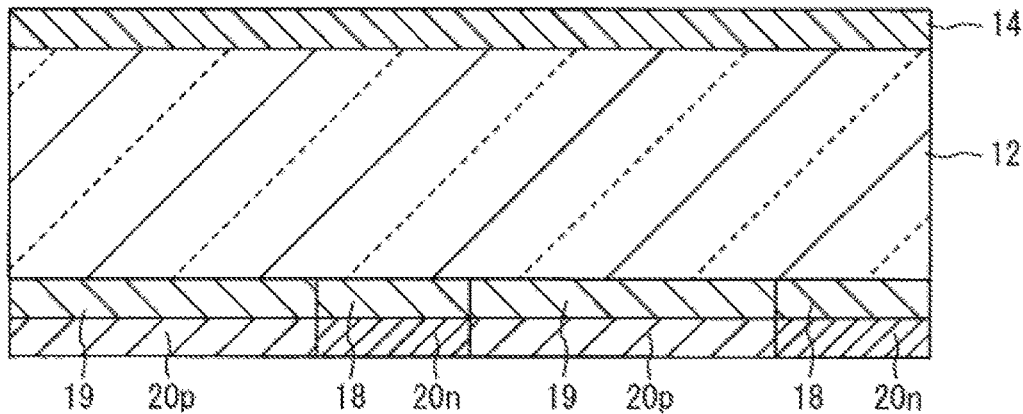
FIG. 2C is a sectional view illustrating the manufacturing method of the photoelectric conversion element illustrated in FIG. 1, and is a sectional view illustrating a state where a passivation film is formed on a light-receiving surface of the silicon substrate.

Next, as illustrated in FIG. 2C, the passivation film 14 is formed on the light-receiving surface of the silicon substrate 12. The passivation film 14 is formed, for example, by the plasma CVD.

Figure 2D:
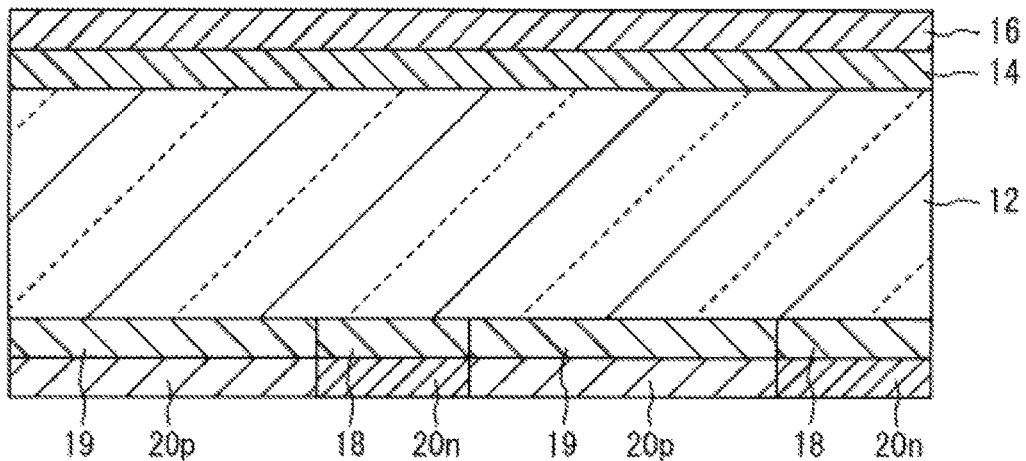
FIG. 2D is a sectional view illustrating the manufacturing method of the photoelectric conversion element illustrated in FIG. 1, and is a sectional view illustrating a state where a reflection prevention film is formed on the passivation film.

Next, as illustrated in FIG. 2D, the reflection preventing film 16 is formed on the passivation film 14. The reflection preventing film 16 is formed, for example, by forming the silicon nitride film, the silicon oxide film, or the silicon oxynitride film, for example, by the plasma CVD.

Figure 2E:
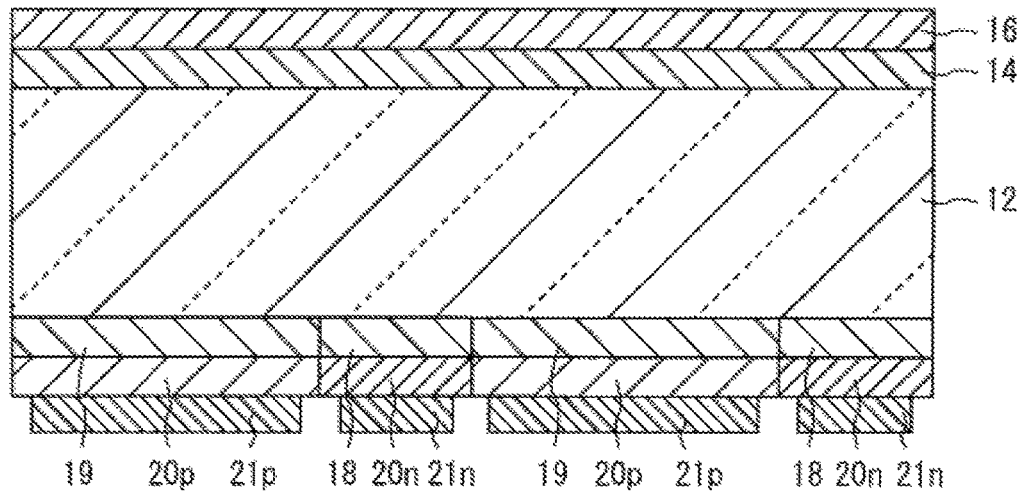
FIG. 2E is a sectional view illustrating the manufacturing method of the photoelectric conversion element illustrated in FIG. 1, and is a sectional view illustrating a state where a metal film is formed.

Next, as illustrated in FIG. 2E, metal films $21n$ and $21p$ are formed. A method of forming the metal films $21n$ and $21p$ is, for example, as follows.

First, on the n-type non-crystalline silicon layer $20n$ and the p-type non-crystalline silicon layer $20p$, by a deposition method or a sputtering method, the metal film made of silver is formed. Next, a resist pattern which serves as a mask is formed on the metal film. The resist pattern is obtained by patterning the resist formed on the metal film. The patterning is performed, for example, by the photolithography method. In a case of being viewed from the thickness direction of the silicon substrate 12, the resist pattern does not overlap a boundary between the n-type non-crystalline silicon layer 20n and the p-type non-crystalline silicon layer 20p.

Next, in the metal film, a part which is not covered with the resist pattern is removed. A method of removing the metal film is, for example, wet etching.

Next, the resist pattern is removed. Accordingly, the metal film 21n is formed on the n-type non-crystalline silicon layer 20n, and the metal film 21p is formed on the p-type non-crystalline silicon layer 20p. A method of removing the resist pattern is, for example, wet etching.

Figure 2F:
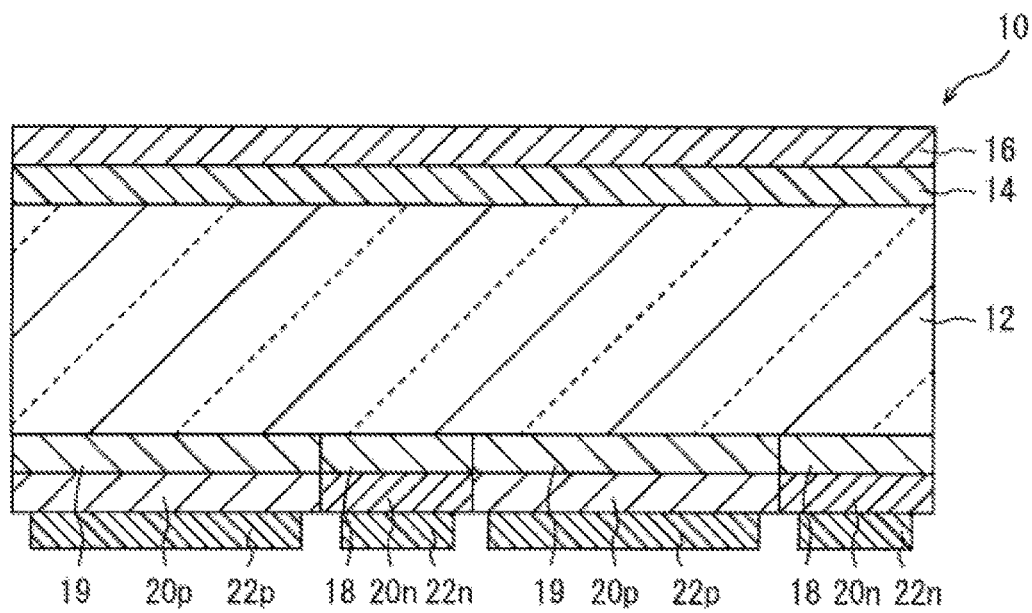
FIG. 2F is a sectional view illustrating the manufacturing method of the photoelectric conversion element illustrated in FIG. 1, and is a sectional view illustrating a state where an electrode is formed.

Next, as illustrated in FIG. 2F, the electrodes 22n and 22p are formed. Accordingly, the photoelectric conversion element 10 which is an object is obtained.

The electrodes 22n and 22p are formed by performing the heat treatment with respect to the metal films 21n and 21p. The heat treatment is performed, for example, by using a hot plate. The time for the heat treatment is, for example, 15 minutes. It is preferable that the temperature of the heat treatment is 125° C. to 225° C. The heat treatment is performed, for example, in the atmosphere. The heat treatment may be performed in the inert atmosphere or in a vacuum. The heat treatment may be performed by some processes, after the metal films 21n and 21p are formed. For example, the heat treatment may be performed by manufacturing a module, or the like. In addition, after performing the heat treatment or the like and growing the metal crystal grain having a desired size, on the electrodes 22n and 22p, further, the conductive film may be formed. In this case, it is possible to determine the boundary between the electrode 22n and the conductive film, and between the electrode 22p and the conductive film, from discontinuity of distribution of the metal crystal grain, discontinuity of composition, or the like.

[Average Crystal Grain Size]

In the photoelectric conversion element 10, by making the average crystal grain size of the plurality of metal crystal grains (hereinafter, simply referred to as an average crystal grain size) included in the electrodes 22n and 22p greater than the thickness of the electrodes 22n and 22p, it is possible to improve the element characteristics. Hereinafter, this will be described. In addition, after performing the heat treatment or the like and growing the metal crystal grain having the desired size, on the electrodes 22n and the electrode 22p, further, the conductive film is formed. In this case, the relationship between an electrode layer on which the metal crystal grain having a desired size is formed, and the thickness of the electrode layer, may satisfy the above-described conditions.

The average crystal grain size is obtained by analyzing the front surfaces of the electrodes 22n and 22p by an electron backscatter diffraction pattern. The electrodes 22n and 22p include the plurality of metal crystal grains.

The average crystal grain size is an average of a product of the crystal grain size of each metal crystal grain and an area occupying ratio. The crystal grain size is obtained by the following equation (1).

$$\text{Crystal grain size} = 2 \times \{(\text{area of crystal grain})/\pi\}^{1/2} \quad (1)$$

The "area of crystal grain" in the equation (1) is measured by using the electron backscatter diffraction pattern. The equation (1) assumes that the calculation is performed on the assumption that the area of the crystal grain is an area of a circle, and on the assumption that the crystal grain size is the diameter of the circle. When obtaining the crystal grain size, a corresponding grain boundary of sigma 3 (Σ3) is not handled as a grain boundary. In addition, in a case where deviation of the crystal orientation is equal to or less than 5 degrees, the same crystal grain is achieved.

The area occupying ratio is obtained by dividing the area of the metal crystal grain by the area of the measurement region. Here, the area of the metal crystal grain is the area when orthographic projection is performed on a plane perpendicular to the thickness direction of the silicon substrate 12. The measurement region is 8 μm×23 μm. Furthermore, the metal crystal grain including the boundary of the measurement region is not included in the calculation of the average crystal grain size.

In a case of being viewed from the thickness direction of the silicon substrate 12, the crystal orientation of the metal crystal grain is preferentially orientated to <111>. In this case, since the crystal orientation of the metal crystal grain is aligned, uniformity of a work function of the metal crystal grain on the interface between the n-type non-crystalline silicon layer 20n and the electrode 22n, and a work function of the metal crystal grain on the interface between the p-type non-crystalline silicon layer 20p and the electrode 22p, is improved. As a result, it is possible to suppress irregularity of the contact resistance. In addition, work functions of a {110} surface, a {100} surface, and a {111} surface of silver, are respectively 4.52 eV, 4.64 eV, and 4.74 eV. The work function of the {111} surface is the largest. Therefore, by making the surface orientation of the metal crystal grain preferentially oriented to {111}, that is, by making the crystal orientation of the metal crystal grain preferentially oriented to <111> with respect to the thickness direction of the silicon substrate 12, in particular, an effect of reducing the contact resistance between the p-type non-crystalline silicon layer 20p and the electrode 22p, is achieved.

In a case where the metal film 21n is heat-treated at 150° C. for 15 minutes, a ratio of occupying the electrode 22n by the metal crystal grain having the crystal orientation of the <111> direction within 10 degrees with respect to the thickness direction of the silicon substrate 12, is 61.9%. In a case where a metal film 21p is heat-treated at 150° C. for 15 minutes, a ratio of occupying the electrode 22p by the metal crystal grain having the crystal orientation of the <111> direction within 10 degrees with respect to the thickness direction of the silicon substrate 12, is 53.5%.

In a case where the film thickness of the electrode 22n is 0.5 μm, in the plurality of metal crystal grains, a ratio of occupying the electrode 22n by the metal crystal grain having the diameter which is equal to or greater than 0.5 μm, is 6.5% before the heat treatment, and is 41.2% after the heat treatment at 150° C. for 15 minutes. In a case where the film thickness of the electrode 22p is 0.5 μm, in the plurality of metal crystal grains, a ratio of occupying the electrode 22p by the metal crystal grain having the diameter which is equal to or greater than 0.5 μm, is 11.9% before the heat treatment, and is 33.3% after the heat treatment at 150° C. for 15 minutes.

Figure 3:
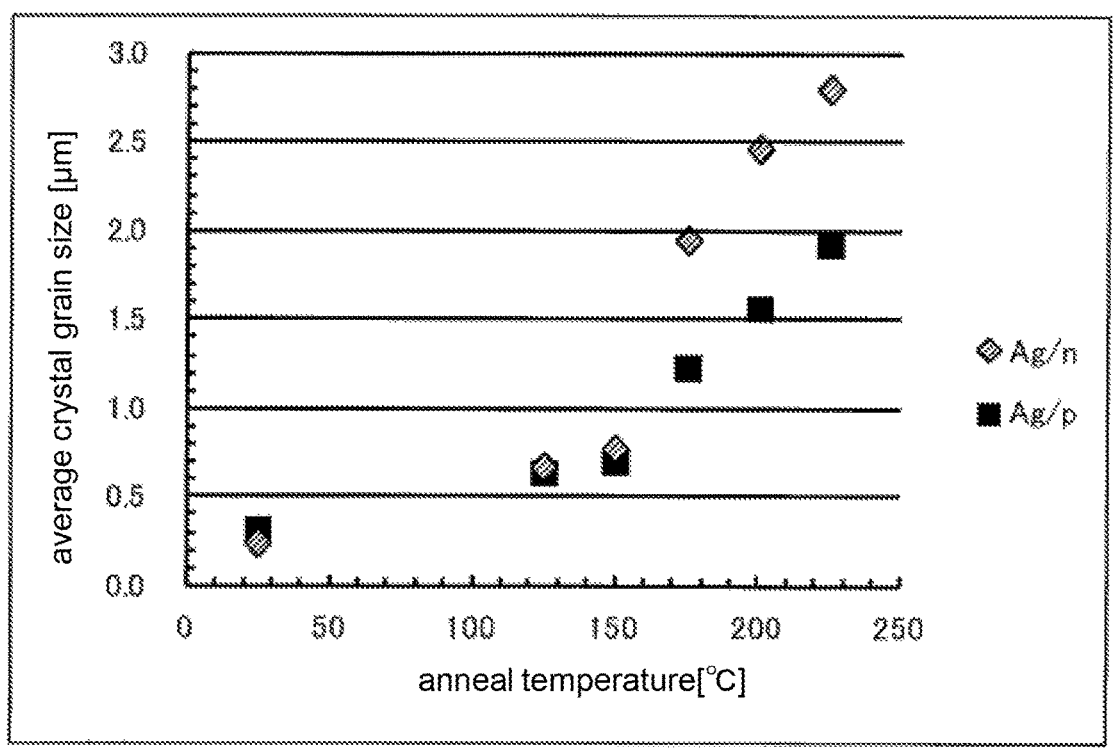
FIG. 3 is a graph illustrating a relationship between an average crystal grain size and the annealing temperature.

The average crystal grain size depends on the temperature (hereinafter, simply referred to as annealing temperature) when the metal films 21n and 21p are heat-treated. FIG. 3 is a graph illustrating a relationship between the average crystal grain size and the annealing temperature. FIG. 3 illustrates the average crystal grain size in a case where the annealing temperature is 25° C. This shows the average crystal grain size in a state where the heat treatment is not performed. As illustrated in FIG. 3, in the electrodes 22n and 22p, as the annealing temperature increases, the average crystal grain size increases. Here, the thickness of the electrodes 22n and 22p is 0.5 μm. In other words, by performing the heat treatment with respect to the metal films 21n and 21p, the average crystal grain size becomes greater than the thickness of the electrodes 22n and 22p.

Figure 4:
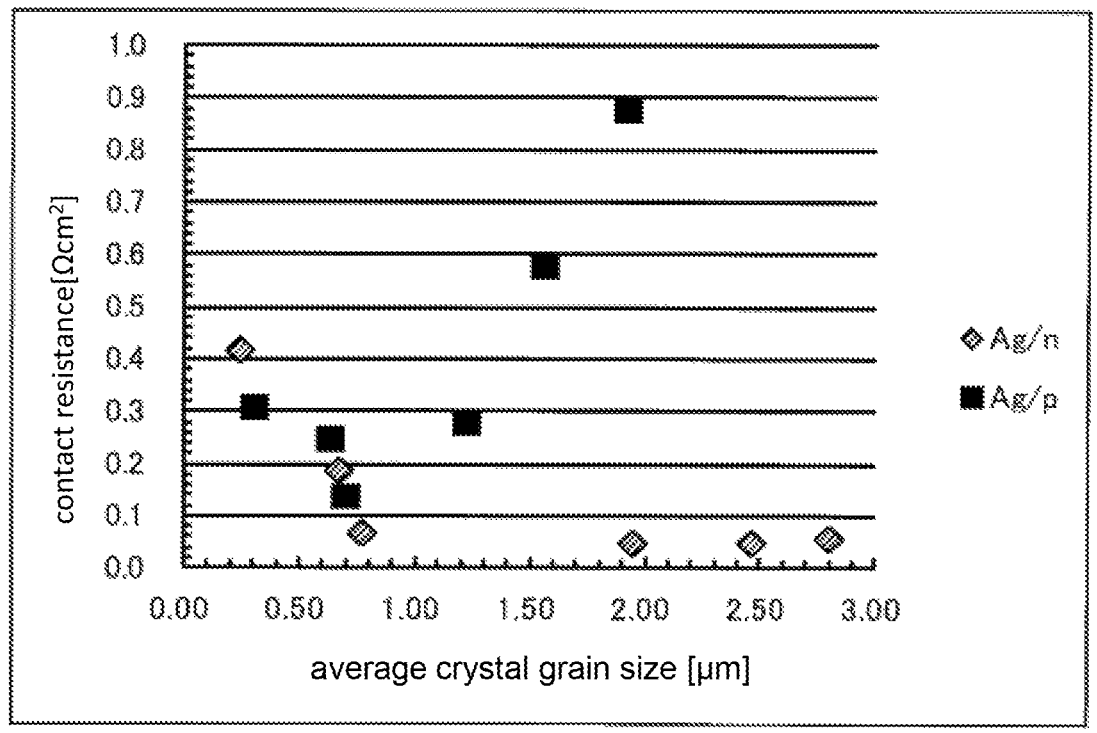
FIG. 4 is a graph illustrating a relationship between the average crystal grain size and contact resistance.

FIG. 4 is a graph illustrating a relationship between the average crystal grain size and the contact resistance.

Figure 5:
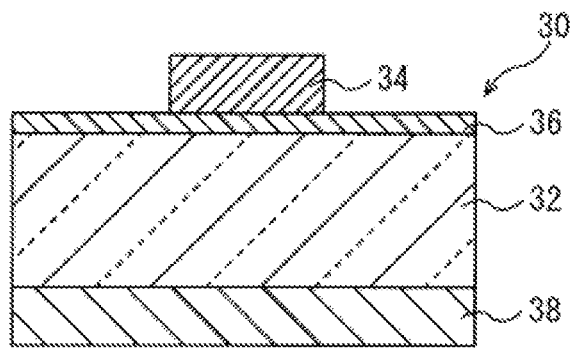
FIG. 5 is a sectional view illustrating a schematic configuration of a sample when the contact resistance is measured.

The contact resistance is measured by creating a sample 30 illustrated in FIG. 5 and using the sample 30. The sample 30 includes a silicon substrate 32, an electrode 34, a non-crystalline silicon layer 36, and an electrode 38.

In the contact resistance between the electrode 22n and the n-type non-crystalline silicon layer 20n, the electrode 34 is considered as the electrode 22n. In this case, the non-crystalline silicon layer 36 contains n-type impurities, and the silicon substrate 32 is an n-type silicon substrate. A resistance ratio of the n-type silicon substrate is equal to or less than 0.01 Ω·cm. The thickness of the electrode 34 are the same as the thickness of the electrode 22n. The thickness and an impurities concentration of the non-crystalline silicon layer 36 are the same as those of the n-type non-crystalline silicon layer 20n. The thickness of the silicon substrate 32 is 300 μm.

In the contact resistance between the electrode 22p and the p-type non-crystalline silicon layer 20p, the electrode 34 as the electrode 22p. In this case, the non-crystalline silicon layer 36 contains p-type impurities, and the silicon substrate 32 is a p-type silicon substrate. A resistance ratio of the p-type silicon substrate is equal to or less than 0.01 Ω·cm. The thickness of the electrode 34 are the same as the thickness of the electrode 22p. The thickness and an impurities concentration of the non-crystalline silicon layer 36 are the same as those of the p-type non-crystalline silicon layer 20p.

In any case where the contact resistance between the electrode 22n and the n-type non-crystalline silicon layer 20n is measured, and where the contact resistance between the electrode 22p and the p-type non-crystalline silicon layer 20p is measured, the electrode 38 is a layered structure of titanium (Ti), palladium (Pd), and silver (Ag).

As illustrated in FIG. 4, when the average crystal grain size in the electrode 22n is greater than the thickness (0.5 μm) of the electrode 22n, the contact resistance between the n-type non-crystalline silicon layer 20n and the electrode 22n becomes lower than the contact resistance in a state where the heat treatment is not performed. Therefore, it is preferable that the average crystal grain size of the electrode (electrode 22n) on the n-type non-crystalline semiconductor is equal to or greater than the film thickness (thickness of the electrode 22n) of the metal film. It is more preferable that the average crystal grain size of the electrode 22n is equal to or greater than 1.34 times the thickness of the electrode 22n.

Specifically, in FIG. 4, in a case where the thickness of the electrode 22n is 0.5 μm, it is more preferable that the average crystal grain size of the electrode 22n is equal to or greater than 0.67 μm.

As illustrated in FIG. 4, the contact resistance between the n-type non-crystalline silicon layer 20n and the electrode 22n can decrease as the average crystal grain size of the electrode 22n increases, and when the average crystal grain size becomes equal to or greater than 1.54 times the thickness of the electrode 22n, substantially the lowest contact resistance can be achieved. Therefore, it is more preferable that the average crystal grain size of the electrode 22n on the n-type non-crystalline semiconductor is equal to or greater than 1.54 times the film thickness of the electrode 22n. Specifically, in FIG. 4, in a case where the thickness of the electrode 22n is 0.5 μm, it is more preferable that the average crystal grain size of the electrode 22n is equal to or greater than 0.77 μm.

Here, as a reason why the contact resistance decreases by increasing the average crystal grain size, for example, the following reason is considered.

Figure 6:
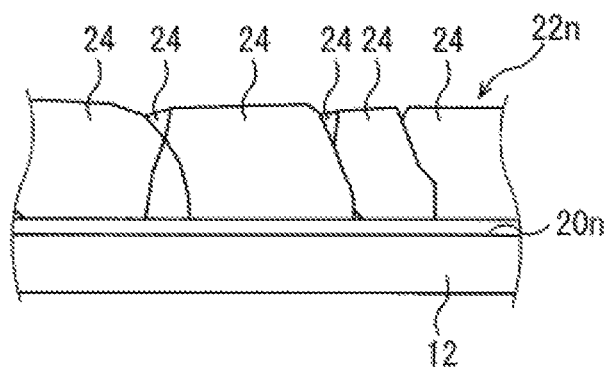
FIG. 6 is a schematic view illustrating an interface level of a metal crystal grain.

As illustrated in FIG. 6, it is considered that a high density interface level is present in the crystal grain boundary which is the interface between the metal crystal grains 24. In other words, as the crystal grain boundary becomes dense, the influence of the interface level increases.

Figure 7:
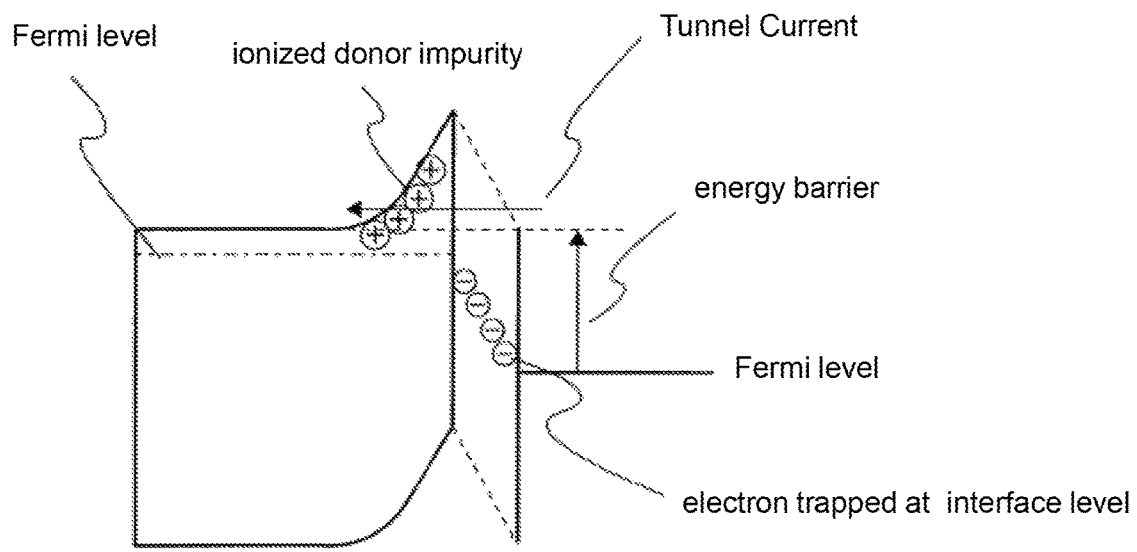
FIG. 7 is a band diagram of the interface between the electrode and the n-type non-crystalline silicon layer in a case where the metal crystal grain is small.

In a case where the metal crystal grain 24 is small, the interface level increases. Therefore, as illustrated in FIG. 7, a dipole is formed between donor impurities ionized in a depletion layer of the n-type non-crystalline silicon layer 20n, and an electron trapped to the interface level of the metal crystal train boundary. As a result, an energy barrier increases, non-ohmic properties are easily achieved, and the contact resistance increases. In addition, in FIG. 7, in order to make it easy to determine the influence of the interface level, it is described that an interface level region is present between the n-type non-crystalline silicon layer 20n and the electrode 22n.

Figure 8:
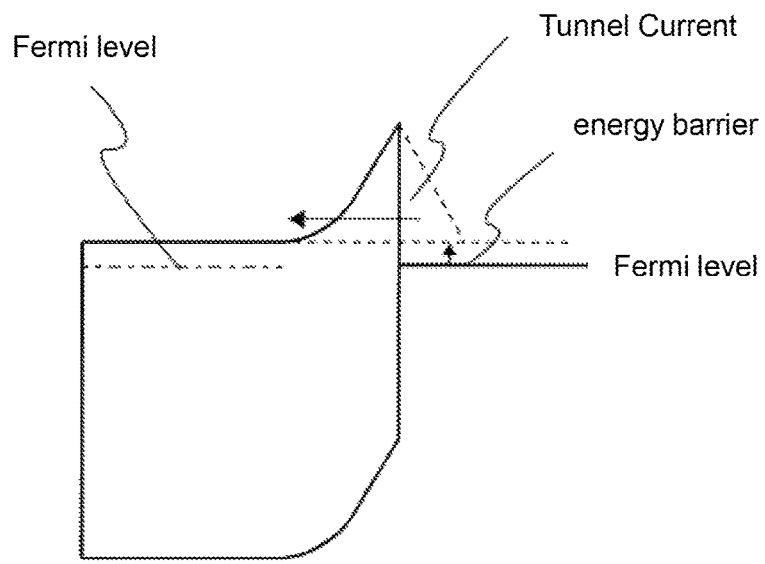
FIG. 8 is a band diagram of the interface between the electrode and the n-type non-crystalline silicon layer in a case where the metal crystal grain is large.

Meanwhile, in a case where the metal crystal grain 24 is large, the crystal grain boundary becomes small. Therefore, the interface level density effectively decreases. In this case, as illustrated in FIG. 8, band bending occurs so that a Fermi level of the n-type non-crystalline silicon layer 20n and a Fermi level of the electrode 22n match each other, and the depletion layer in the n-type non-crystalline silicon layer 20n is formed. In a case where the donor impurities concentration in the n-type non-crystalline silicon layer 20n is sufficiently high, the depletion layer width becomes sufficiently small, and a tunnel current flows. In this case, since an energy barrier between the n-type non-crystalline silicon layer 20n and the electrode 22n is small, ohmic properties are achieved, and the contact resistance becomes low. In other words, the contact resistance in a case where the crystal grain size of the metal crystal grain 24 is large can be low. When the average crystal grain size in the electrode 22n is greater than the film thickness of the electrode 22n, since most of the crystal grain boundary between the metal crystal grains 24 penetrate in the film thickness direction of the electrode 22n, the crystal grain boundary density becomes extremely low in the vicinity of the interface with the n-type non-crystalline silicon layer 20n, and the interface level density becomes extremely small. Therefore, it is preferable that the average crystal grain size in the electrode 22n is greater than the film thickness of the electrode 22n. Similarly, it is preferable that the average crystal grain size in the electrode 22p is greater than the film thickness of the electrode 22p.

In FIG. 4, when the average crystal grain size in the electrode 22p becomes greater than 2.44 times (1.22 μm) the thickness of the electrode 22p, the contact resistance between the p-type non-crystalline silicon layer 20p and the electrode 22p becomes higher than the contact resistance in a state where the heat treatment is not performed. In other words, in a case where the average crystal grain size in the electrode 22p is 1 times to 2.44 times (0.5 μm to 1.22 μm) the thickness of the electrode 22p, the contact resistance between the p-type non-crystalline silicon layer 20p and the electrode 22p becomes smaller than the contact resistance in a state where the heat treatment is not performed.

Furthermore, in a case where the average crystal grain size in the electrode 22p is equal to or greater than 1.26 times or greater and equal to or less than 2.44 times or less than the thickness of the electrode 22p (in a case where the thickness of the electrode 22p is 0.5 µm, the average crystal grain size is equal to or greater than 0.63 µm and equal to or less than 1.22 µm), the contact resistance becomes extremely low.

Therefore, the average crystal grain size of the electrode 22p is preferably greater than the thickness of the electrode 22p, and more preferably, greater than 1 time and equal to or less than 2.44 times than the thickness of the electrode 22p. Specifically, in a case where the thickness of the electrode 22p is 0.5 µm, the average crystal grain size of the electrode 22p is preferably greater than 0.5 µm, and more preferably greater than 0.5 µm and equal to or less than 1.22 µm.

More preferably, the average crystal grain size of the electrode 22p is equal to or greater than 1.26 times and equal to or less than 2.44 times the thickness of the electrode 22p. Specifically, in a case where the thickness of the electrode 22p is 0.5 µm, the average crystal grain size of the electrode 22p is equal to or greater than 0.63 µm and equal to or less than 1.22 µm.

The reason why the contact resistance becomes low in a case where the average crystal grain size in the electrode 22p is 1 times to 2.44 times (0.5 µm to 1.22 µm) the thickness of the electrode 22p, is considered to be similar to the reason why the contact resistance becomes low in a case where the average crystal grain size in the electrode 22n is greater than the thickness of the electrode 22n.

It is considered that the reason why the contact resistance between the p-type non-crystalline silicon layer 20p and the electrode 22p becomes high is, for example, that the high resistance layer made of silver oxide or silicon oxide is formed on the interface between the p-type non-crystalline silicon layer 20p and the electrode 22p. Practically, by auger electron spectroscopy, in the vicinity of the interface between the p-type non-crystalline silicon layer 20p and the electrode 22p, silver oxide or silicon oxide is detected. In other words, on the interface between the p-type non-crystalline silicon layer 20p and the electrode 22p, it is apparent that unique oxidization proceeds, unlike the interface between the n-type non-crystalline silicon layer 20n and the electrode 22n.

Figure 9:
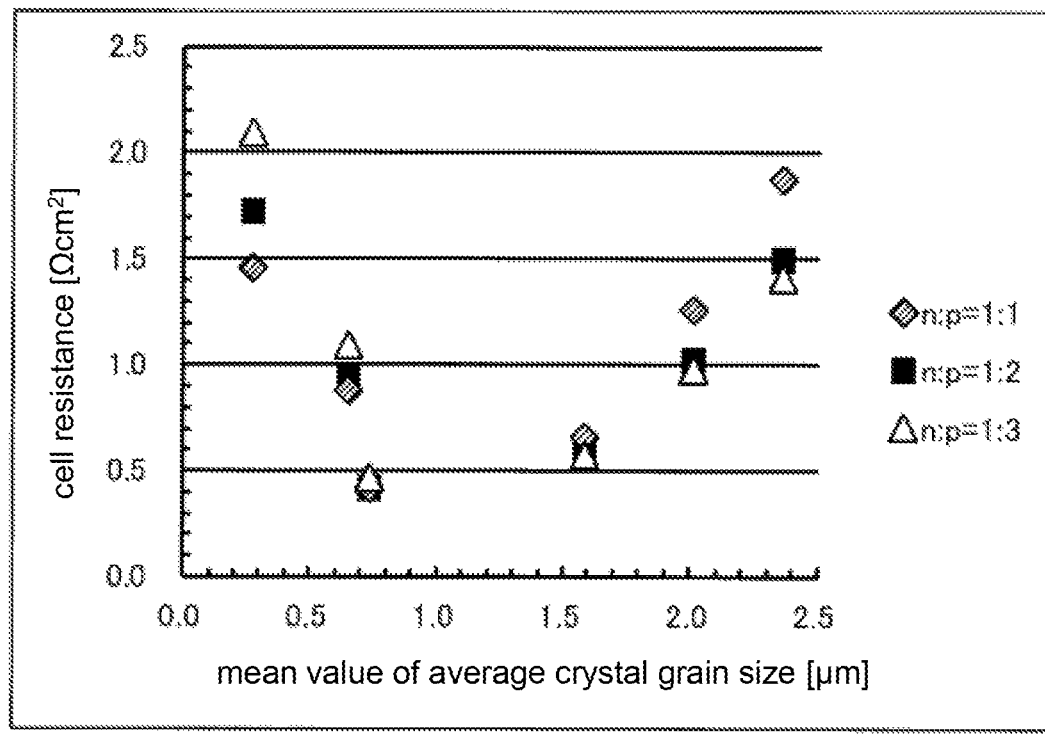
FIG. 9 is a graph illustrating a relationship between cell resistance and an average value of the average crystal grain size.

FIG. 9 is a graph illustrating a relationship between the contact resistance (cell resistance) per 1 cm² of a photoelectric conversion element, and an average value of the average crystal grain size.

The cell resistance is the contact resistance of the photoelectric conversion element 10 when a ratio of the contact area between the electrode 22n and the n-type non-crystalline silicon layer 20n, and the contact area between the electrode 22p and the p-type non-crystalline silicon layer 20p, is assumed. In FIG. 9, each expression in the general example, such as n:p=1:1, n:p=1:2, n:p=1:3, illustrates that ratios of the contact area between the electrode 22n and of the n-type non-crystalline silicon layer 20n, and the contact area between the electrode 22p and the p-type non-crystalline silicon layer 20p, are respectively 1:1, 1:2, and 1:3. The average value of the average crystal grain size is an average value of the average crystal grain size in the electrode 22n and the average crystal grain size in the electrode 22p.

In a case where the contact area between the electrode 22n and the n-type non-crystalline silicon layer 20n is 1, and the contact area between the electrode 22p and the p-type non-crystalline silicon layer 20p is N, the cell resistance is obtained by the following equation (2).

Cell resistance={(the contact resistance between the electrode 22n and the n-type non-crystalline silicon layer 20n)×(1+N)}+{(the contact resistance between the electrode 22p and the p-type non-crystalline silicon layer 20p)}×(1+N)/N} (2)

As illustrated in FIG. 9, in a case where the contact area between the electrode 22p and the p-type non crystalline silicon layer 20p is equal to or greater then 2 times the contact area between the electrode 22n and the n-type non-crystalline silicon layer 20n, and the average value of the average crystal grain size is equal to or greater than 0.65 µm and equal to or less than 2.36 µm, the cell resistance becomes lower than the cell resistance in state where the heat treatment is not performed (the average value of the average crystal grain size=0.27 µm). In other words, in a case where the contact area between the electrode 22p and the p-type non-crystalline silicon layer 20p is equal to or greater than 2 times the contact area between the electrode 22n and the n-type non-crystalline silicon layer 20n, it is preferable that the average value of the average crystal grain size is equal to or greater than 1.3 times and equal to or less than 4.72 times the thickness of the electrodes 22n and 22p. In this case, the cell resistance which lower than the cell resistance in a state where the heat treatment is not performed, is obtained, and the element characteristics are improved.

As illustrated in FIG. 9, in a case where the contact area between the electrode 22p and the p-type non-crystalline silicon layer 20p is equal to 1 times the contact area between the electrode 22n and the n-type non-crystalline silicon layer 20n, and the average value of the average crystal grain size is equal to or greater than 0.65 µm and equal to or less than 2.0 µm, the cell resistance becomes lower than the cell resistance in a state where the heat treatment is not performed. In other words, in a case where the contact area between the electrode 22p and the p-type non-crystalline silicon layer 20p is equal to or greater than 1 times the contact area between the electrode 22n and the n-type non-crystalline silicon layer 20n, it is preferable that the average value of the average crystal grain size is equal to or greater than 1.3 times and equal to or less than 4 times the thickness of the electrodes 22n and 22p. In this case, the cell resistance which is lower than the cell resistance in a state where the heat treatment is not performed, is obtained, and the element characteristics are improved.

It is preferable that the average value of the average crystal grain size is equal to or greater than 1.3 times and equal to or less than 3.18 times the thickness of the electrodes 22n and 22p. In this case, extremely low cell resistance is obtained. Specifically, when the thickness of the electrodes 22n and 22p is 0.5 µm, it is preferable that the average value of the average crystal grain size is equal to or greater than 0.65 µm and equal to or less than 1.59 µm.

It is more preferable that the average value of the average crystal grain size is equal to or greater than 1.46 times and equal to or less than 3.18 times the thickness of the electrodes 22n and 22p. In this case, extremely low cell resistance is obtained. Specifically, when the thickness of the electrodes 22n and 22p is 0.5 µm, it is preferable that the average value of the average crystal grain size is equal to or greater than 0.73 µm and equal to or less than 1.59 1.59 µm.

Figure 10:
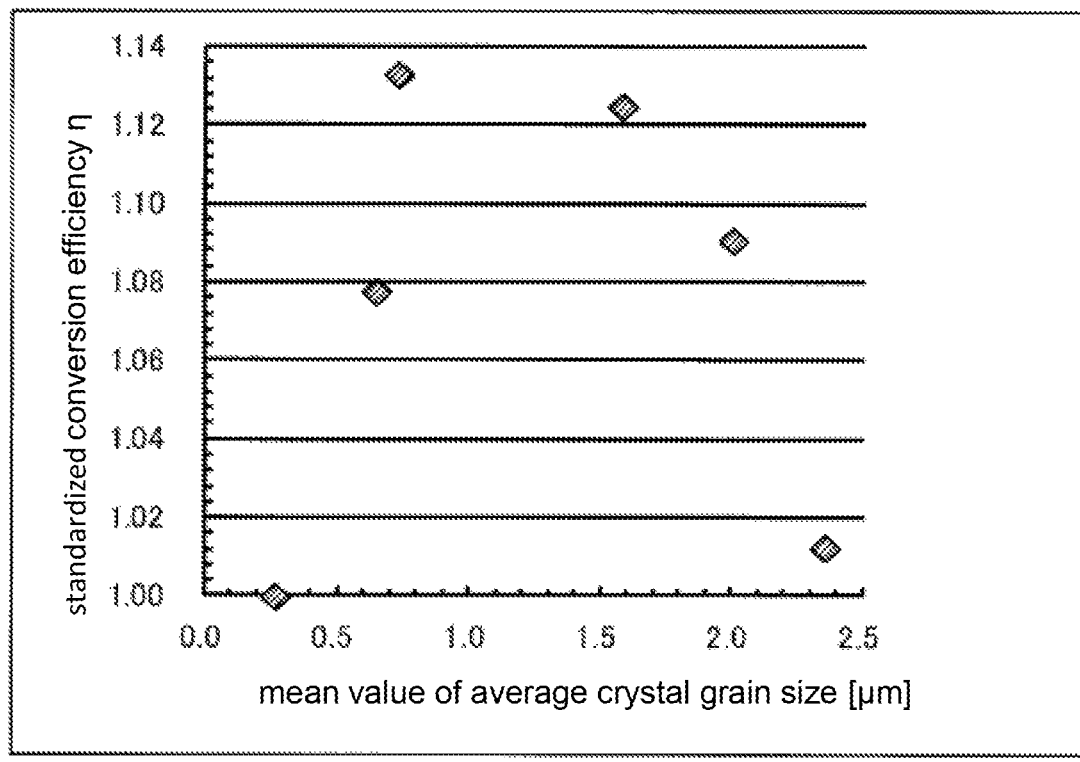
FIG. 10 is a graph illustrating a relationship between conversion efficiency η and the average value of the average crystal grain size.

FIG. 10 is a graph illustrating a relationship between conversion efficiency η and the average crystal grain size. The conversion efficiency η is standardized by using the conversion efficiency η in a state where the heat treatment is not performed as a standard. The average value of the average crystal grain size is a value obtained by averaging the average crystal grain size of the plurality of metal crystal grains contained in the electrode 22n, and the average crystal grain size of the plurality of metal crystal grains contained in the electrode 22p.

Figure 11:
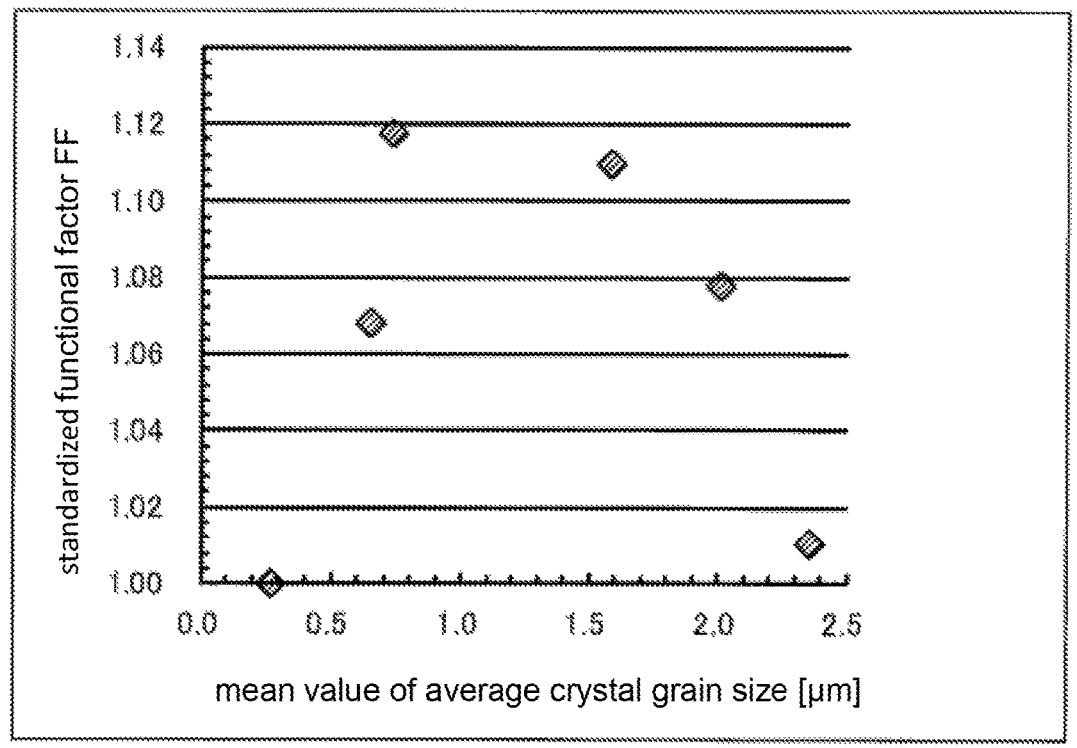
FIG. 11 is a graph illustrating a relationship between a curve factor μF and the average value of the average crystal grain size.

FIG. 11 is a graph illustrating a relationship between a curve factor FF and the average crystal grain size. The curve factor FF is standardized by using the curve factor FF in a state where the heat treatment is not performed as a standard. The average value of the average crystal grain size is a value obtained by averaging the average crystal grain size of the plurality of metal crystal grains contained in the electrode 22n, and the average crystal grain size of the plurality of metal crystal grains contained in the electrode 22p.

FIGS. 10 and 11 illustrate the measurement result of a case where the thickness of the electrodes 22n and 22p is 0.5 μm, and the contact area between the electrode 22p and the p-type non-crystalline silicon layer 20p is 3 times the contact area between the electrode 22n and the n-type non-crystalline silicon layer 20n. As illustrated in FIGS. 10 and 11, in a case where the average crystal grain size is greater than the thickness of the electrodes 22n and 22p, the element characteristics (specifically, the conversion efficiency η and the curve factor FF) are improved. In particular, the curve factor FF is improved because the contact resistance between the n-type non-crystalline silicon layer 20n and the electrode 22n and the contact resistance between the p-type non-crystalline silicon layer 20p and the electrode 22p become low by performing the heat treatment. In other words, in the photoelectric conversion element 10, since the contact resistance between the n-type non-crystalline silicon layer 20n and the electrode 22n and the contact resistance between the p-type non-crystalline silicon layer 20p and the electrode 22p can become low, it is possible to improve the curve factor FF. As a result, it is possible to improve the conversion efficiency η.

It is preferable that the average value of the average crystal grain size is greater than the thickness of the electrodes 22n and 22p, and equal to or less than 4.72 times the thickness of the electrodes 22n and 22p. Specifically, in a case where the thickness of the electrodes 22n and 22p is 0.5 μm, it is preferable that the average value of the average crystal grain size is greater than 0.5 μm and equal to or less than 2.36 μm. In this case, as illustrated in FIGS. 10 and 11, the element characteristics are further improved.

It is more preferable that the average value of the average crystal grain size is equal to or greater than 1.3 times the thickness of the electrodes 22n and 22p, and equal to or less than 4.0 times the thickness of the electrodes 22n and 22p. Specifically, in a case where the thickness of the electrodes 22n and 22p is 0.5 μm, it is more preferable that the average crystal grain size is equal to or greater than 0.65 μm and equal to or less than 2.0 μm. In this case, as illustrated in FIGS. 10 and 11, the element characteristics are still further improved.

It is still more preferable that the average value of the average crystal grain size is equal to or greater than 1.3 times the thickness of the electrodes 22n and 22p, and equal to or less than 3.18 times or less than the thickness of the electrodes 22n and 22p. Specifically, in a case where the thickness of the electrodes 22n and 22p is 0.5 μm, it is still more preferable that the average crystal grain size is equal to or greater than 0.65 μm and equal to or less than 1.59 μm. In this case, as illustrated in FIGS. 10 and 11, the element characteristics are still further improved.

It is still more preferable that the average value of the average crystal grain size is equal to or greater than 1.46 times the thickness of the electrodes 22n and 22p, and equal to or less than 3.18 times the thickness of the electrodes 22n and 22p. Specifically, in a case where the thickness of the electrodes 22n and 22p is 0.5 μm, it is more preferable that the average crystal grain size is equal to or greater than 0.73 μm and equal to or less than 1.59 μm. In this case, as illustrated in FIGS. 10 and 11, the element characteristics are still further improved.

Figure 12:
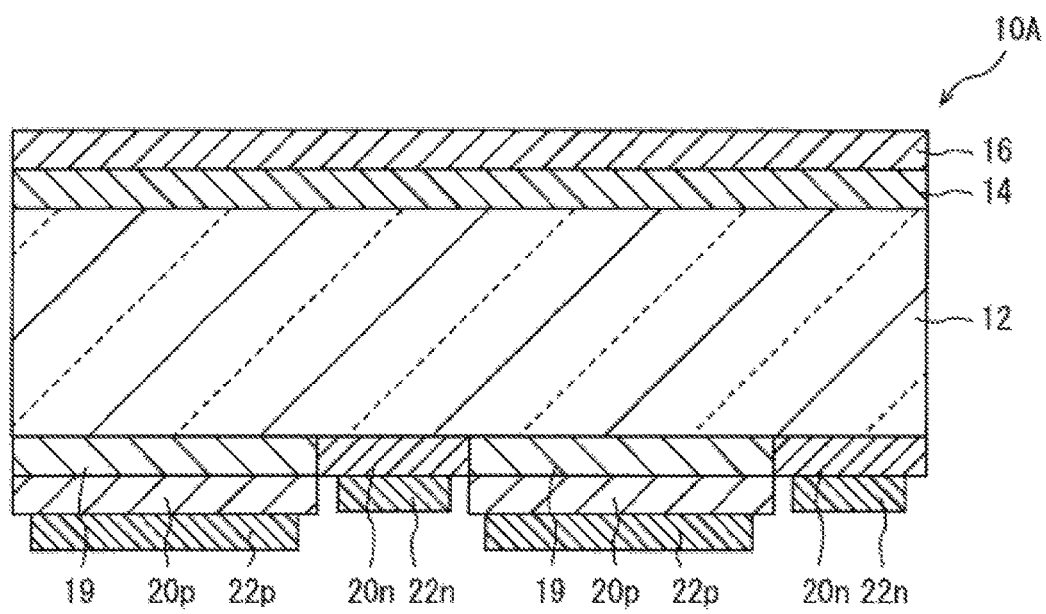
FIG. 12 is a sectional view illustrating an example of a schematic configuration of a photoelectric conversion element according to an application example 1 of the first embodiment of the present invention.
Figure 13:
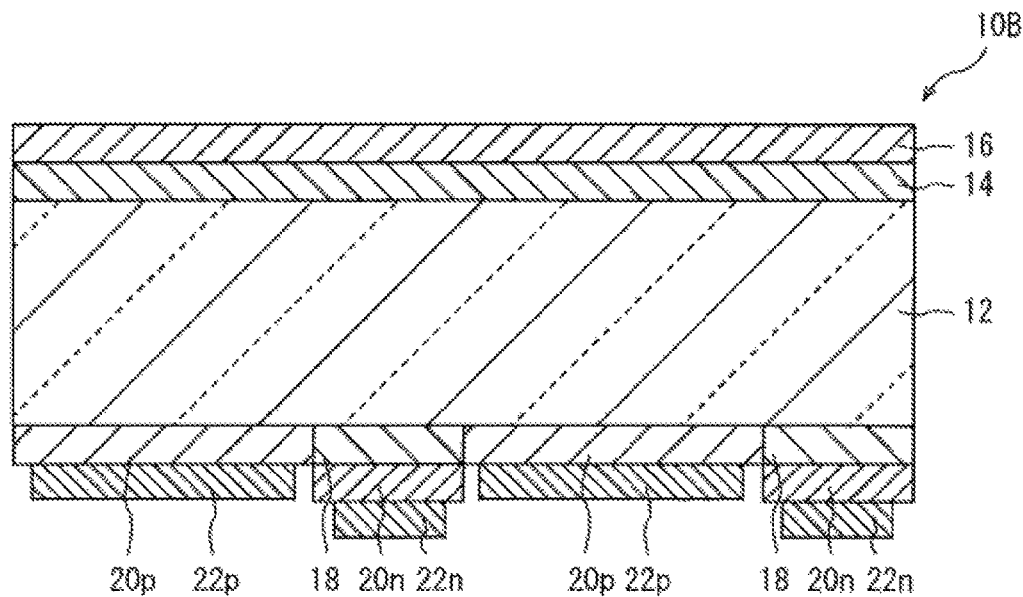
FIG. 13 is a sectional view illustrating an example of a schematic configuration of a photoelectric conversion element according to an application example 2 of the first embodiment of the present invention.
Figure 14:
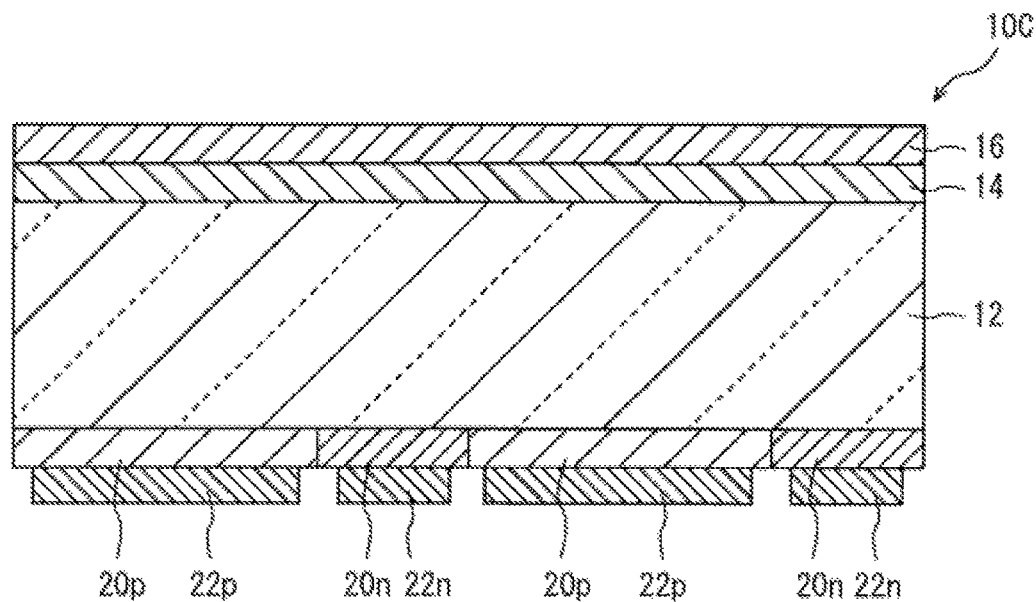
FIG. 14 is a sectional view illustrating an example of a schematic configuration of a photoelectric conversion element according to an application example 3 of the first embodiment of the present invention.

Application Examples 1 to 3 of Photoelectric Conversion Element According to First Embodiment The photoelectric conversion element according to the first embodiment of the present invention may have the configurations illustrated in FIGS. 12 to 14.

FIG. 12 is a sectional view illustrating an example of a schematic configuration of a photoelectric conversion element 10A according to an application example 1 of the first embodiment of the present invention. As illustrated in FIG. 12, the photoelectric conversion element 10A is not provided with the intrinsic non-crystalline silicon layer 18 compared to the photoelectric conversion element 10.

When manufacturing the photoelectric conversion element 10A, for example, the intrinsic non-crystalline silicon layer and the p-type non-crystalline silicon layer are formed in order on the rear surface of the silicon substrate 12. Next, in the p-type non-crystalline silicon layer, a part except the part which becomes the p-type non-crystalline silicon layer 20p later is removed, and in the intrinsic non-crystalline silicon layer, a part except the part which becomes the intrinsic non-crystalline silicon layer 19 later is removed. Next, on the coating layer formed on the p-type non-crystalline silicon layer 20p, and on the rear surface of the silicon substrate 12, the n-type non-crystalline silicon layer is formed. Next, the coating layer formed on the p-type non-crystalline silicon layer 20p is removed. Accordingly, on the rear surface of the silicon substrate 12, the intrinsic non-crystalline silicon layer 19 and the n-type non-crystalline silicon layer 20n are formed, and the p-type non-crystalline silicon layer 20p is formed on the intrinsic non-crystalline silicon layer 19.

FIG. 13 is a sectional view illustrating an example of a schematic configuration of a photoelectric conversion element 10B according to an application example 2 of the first embodiment of the present invention. As illustrated in FIG. 13, the photoelectric conversion element 10B is not provided with the intrinsic non-crystalline silicon layer 19 compared to the photoelectric conversion element 10.

When manufacturing the photoelectric conversion element 10B, for example, the intrinsic non-crystalline silicon layer, the n-type non-crystalline silicon layer, and the coating layer are formed in order on the rear surface of the silicon substrate 12. Next, by using the photolithography method, the coating layer, the n-type non-crystalline silicon layer, and the intrinsic non-crystalline silicon layer are patterned, a part of the silicon substrate 12 is exposed, and the n-type non-crystalline silicon layer 20n and the intrinsic non-crystalline silicon layer 18 are formed. At this time, the coating layer is formed on the n-type non-crystalline silicon layer 20n. Next, on the coating layer formed on the n-type non-crystalline silicon layer 20n, and on the rear surface of the silicon substrate 12, the p-type non-crystalline silicon layer is formed. Next, the coating layer formed on the n-type non-crystalline silicon layer 20n is removed. Accordingly, on the rear surface of the silicon substrate 12, the intrinsic non-crystalline silicon layer 18 and the p-type non-crystalline silicon layer 20p are formed, and the n-type non-crystalline silicon layer 20n is formed on the intrinsic non-crystalline silicon layer 18.

FIG. 14 is a sectional view illustrating an example of a schematic configuration of a photoelectric conversion element 10C according to an application example 3 of the first embodiment of the present invention. As illustrated in FIG. 14, the photoelectric conversion element 10C is not provided with the intrinsic non-crystalline silicon layers 18 and 19 compared to the photoelectric conversion element 10.

When manufacturing the photoelectric conversion element 10C, for example, the n-type non-crystalline silicon layer and the coating layer are formed in order on the rear surface of the silicon substrate 12. Next, the coating layer and the n-type non-crystalline silicon layer are patterned, a part of the silicon substrate 12 is exposed, and the n-type non-crystalline silicon layer 20n is formed. At this time, the coating layer is formed on the n-type non-crystalline silicon layer 20n. Next, on the coating layer formed on the n-type non-crystalline silicon layer 20n, and on the rear surface of the silicon substrate 12, the p-type non-crystalline silicon layer is formed. Next, the coating layer formed on the n-type non-crystalline silicon layer 20n is removed. Accordingly, on the rear surface of the silicon substrate 12, the n-type non-crystalline silicon layer 20n and the p-type non-crystalline silicon layer 20p are formed.

Second Embodiment

Figure 15:
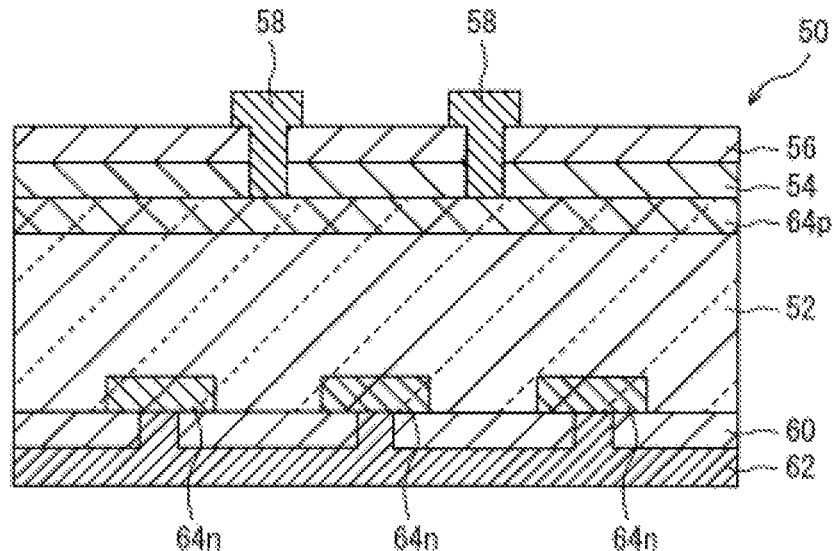
FIG. 15 is a sectional view illustrating a schematic configuration of a photoelectric conversion element according to a second embodiment of the present invention.

FIG. 15 is a sectional view illustrating a configuration of a photoelectric conversion element 50 according to a second embodiment of the present invention. The photoelectric conversion element 50 includes a silicon substrate 52, a non-crystalline film 54, a non-crystalline film 56, an electrode 58, an insulation film 60, and an electrode 62.

The silicon substrate 52 is an n-type single crystal silicon substrate. The silicon substrate 52 includes a p-type diffusion layer 64p and an n-type diffusion layer 64n.

The p-type diffusion layer 64p contains, for example, boron (B) as p-type impurities. The maximum concentration of boron (B) is, for example, $1\times10^{18}$ cm$^{-3}$ to $1\times10^{20}$ cm$^{-3}$. The thickness of the p-type diffusion layer 64p is, for example, 50 nm to 1000 nm.

The n-type diffusion layer 64n is in contact with the rear surface opposite to the light incident side of the silicon substrate 52, and is disposed at a desired interval in the in-surface direction of the silicon substrate 52. The n-type diffusion layer 64n contains, for example, phosphorus (P) as n-type impurities. The maximum concentration of phosphorus (P) is, for example, $1\times10^{18}$ cm$^{-3}$ to $1\times10^{20}$ cm$^{-3}$. The thickness of the n-type diffusion layer 64n is, for example, 50 nm to 1000 nm.

Other description of the silicon substrate 52 is the same as the description of the silicon substrate 12.

The non-crystalline film 54 is disposed to be in contact with the front surface on the light-incident side of the silicon substrate 52. The non-crystalline film 54 includes at least the non-crystalline phase, and made of, for example, a-Si:H. The thickness of the non-crystalline film 54 is, for example, 1 nm to 20 nm.

The non-crystalline film 56 is disposed to be in contact with the non-crystalline film 54. The non-crystalline film 54 includes at least the non-crystalline phase, and made of, for example, silicon nitride. The thickness of the non-crystalline film 56 is, for example, 50 nm to 200 nm.

The electrode 58 penetrates the non-crystalline film 54 and the non-crystalline film 56, is in contact with the p-type diffusion layer 64p of the silicon substrate 52, and is disposed on the non-crystalline film 56. The electrode 58 is made of silver.

The insulation film 60 is disposed to be in contact with the rear surface of the silicon substrate 52. The insulation film 60 is made of, for example, silicon oxide, silicon nitride, silicon oxynitride, and aluminum oxide. The thickness of the insulation film 60 is, for example, 50 nm to 1000 nm.

The electrode 62 penetrates the insulation film 60, is in contact with the n-type diffusion layer 64n of the silicon substrate 52, and is disposed to cover the insulation film 60. The electrode 62 is made of silver.

Manufacturing Method of Photoelectric Conversion Element

With reference to FIGS. 16A to 16G, a manufacturing method of the photoelectric conversion element 50 will be described.

Figure 16A:
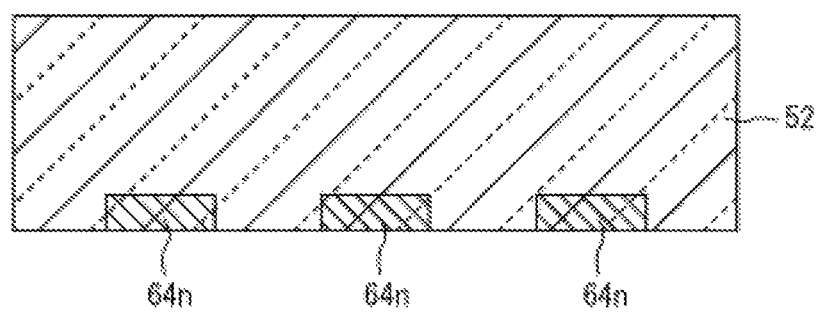
FIG. 16A is a sectional view illustrating a manufacturing method of the photoelectric conversion element illustrated in FIG. 15, and is a sectional view illustrating a state where an n-type diffusion layer is formed on the rear surface side of the silicon substrate.

First, as illustrated in FIG. 16A, the n-type diffusion layer 64n is formed on the silicon substrate 52. Specifically, first, the silicon substrate 52 is prepared. Next, the rear surface of the silicon substrate 52 is coated with the resist. Next, the resist is patterned by the photolithography method, and the resist pattern is formed. Next, by using the resist pattern as a mask, the n-type impurities, such as P and arsenic (As), are ion-injected into the silicon substrate 52. According to this, the n-type diffusion layer 64n is formed on the rear surface side of the silicon substrate 52. In addition, after the ion injection, the heat treatment may be performed for electrically vitalizing the n-type impurities. Instead of the ion injection method, a gas phase diffusion method, a solid phase diffusion method, a plasma doping method, or an ion doping method, may be used.

Figure 16B:
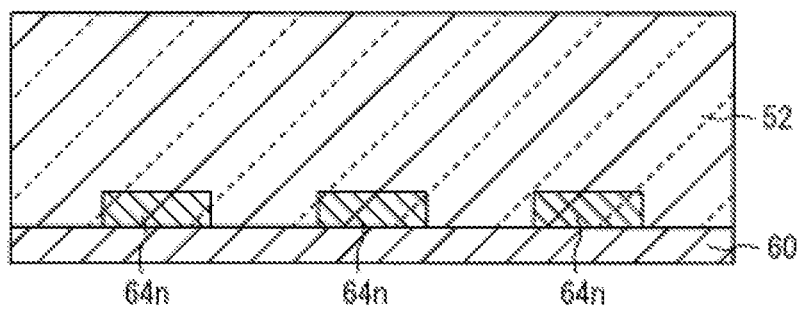
FIG. 16B is a sectional view illustrating the manufacturing method of the photoelectric conversion element illustrated in FIG. 15, and is a sectional view illustrating a state where an insulation film is formed on the rear surface of the silicon substrate.

Next, as illustrated in FIG. 16B, the insulation film 60 is formed on the entire rear surface of the silicon substrate 52. The insulation film 60 is formed, for example, by the plasma CVD method. In addition, the insulation film 60 may be formed by an atomic layer deposition method (ALD) and a heat CVD method.

Figure 16C:
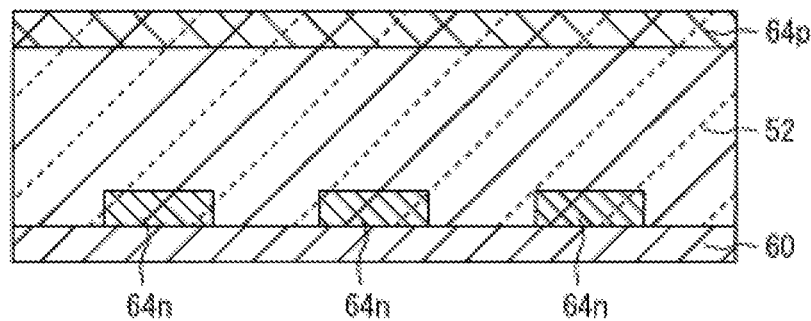
FIG. 16C is a sectional view illustrating the manufacturing method of the photoelectric conversion element illustrated in FIG. 15, and is a sectional view illustrating a state where a p-type diffusion layer is formed on a front surface side of the silicon substrate.

Next, as illustrated in FIG. 16C, the p-type diffusion layer 64p is formed on the silicon substrate 52. Specifically, the p-type impurities, such as B, gallium (Ga), or indium (In), are ion-injected into the silicon substrate 52 from the light-incident side. Accordingly, the p-type diffusion layer 64p is formed on the light-incident side of the silicon substrate 52. In addition, after the ion injection, the heat treatment may be performed for electrically vitalizing the p-type impurities. Instead of the ion injection method, a gas phase diffusion method, a solid phase diffusion method, a plasma doping method, or an ion doping method, may be used.

Figure 16D:
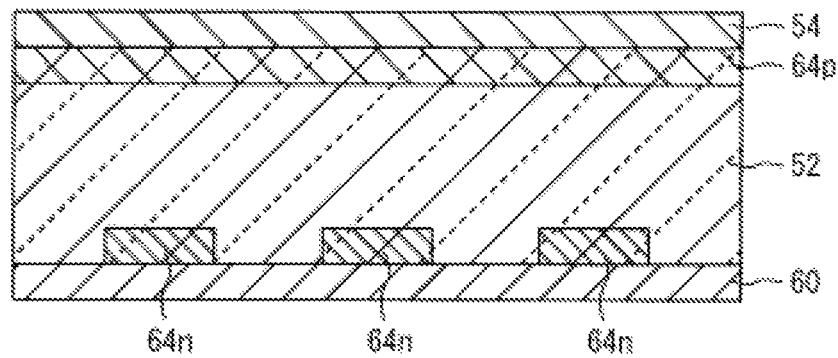
FIG. 16D is a sectional view illustrating the manufacturing method of the photoelectric conversion element illustrated in FIG. 15, and is a sectional view illustrating a state where a non-crystalline film is formed on the light-receiving surface of the silicon substrate.

Next, as illustrated in FIG. 16D, the non-crystalline film 54 is formed on the light-receiving surface of the silicon substrate 52. The non-crystalline film 54 is formed, for example, by the plasma CVD.

Figure 16E:
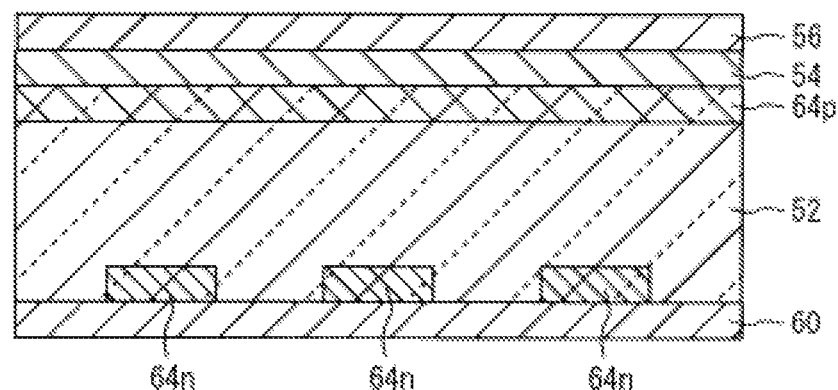
FIG. 16E is a sectional view illustrating the manufacturing method of the photoelectric conversion element illustrated in FIG. 15, and is a sectional view illustrating a state where the non-crystalline film is formed on the passivation film.

Next, as illustrated in FIG. 16E, the non-crystalline film 56 is formed on the non-crystalline film 54. The non-crystalline film 56 is formed, for example, by the plasma CVD.

Figure 16F:
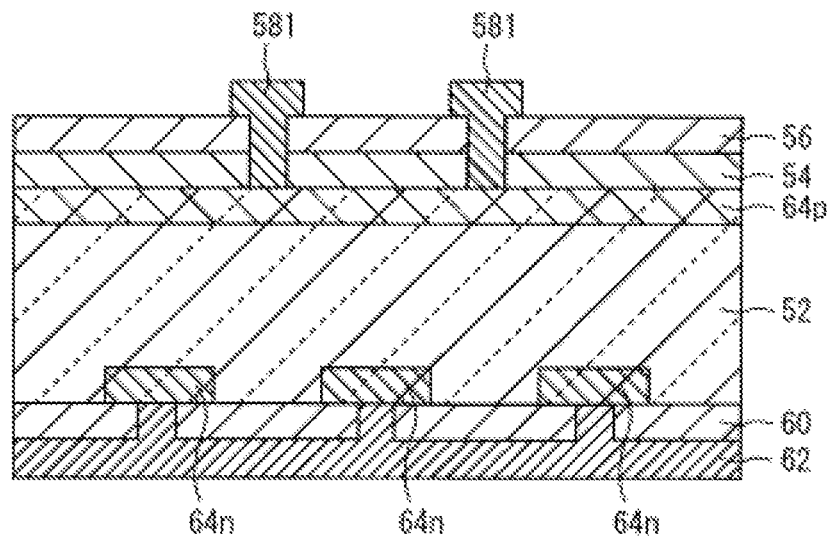
FIG. 16F is a sectional view illustrating the manufacturing method of the photoelectric conversion element illustrated in FIG. 15, and is a sectional view illustrating a state where the metal film is formed.

Next, as illustrated in FIG. 16F, metal films 581 and 621 are formed. A forming method of the metal films 581 and 621 is, for example, as follows.

First, the entire surface of the non-crystalline film 56 is coated with the resist. Next, the resist is patterned by the photolithography method, and the resist pattern is formed. Next, by using mixed liquid of hydrofluoric acid and nitric acid by using a photoresist as a mask, etching is performed with respect to a part of the non-crystalline film 56 and the non-crystalline film 54. Next, resist pattern is removed.

Accordingly, a part of the p-type diffusion layer 64p is exposed. Next, by the deposition method or the sputtering method, the metal film on which silver is layered on titanium, is formed on the entire surface of the non-crystalline film 56. Next, the metal film is patterned. Accordingly, the metal film 581 is formed.

Next, the entire surface of the insulation film 60 is coated with the resist. Next, the resist is patterned by the photolithography method, and the resist pattern is formed. Next, by using the resist pattern as a mask, by using hydrofluoric acid, the etching is performed with respect to a part of the insulation film 60, and the resist pattern is removed. Accordingly, a part of the n-type diffusion layer 64n of the silicon substrate 52 is exposed.

Next, by using the deposition method or the sputtering method, the metal film 621 made of Ag is formed so as to cover the insulation film 60.

Figure 16G:
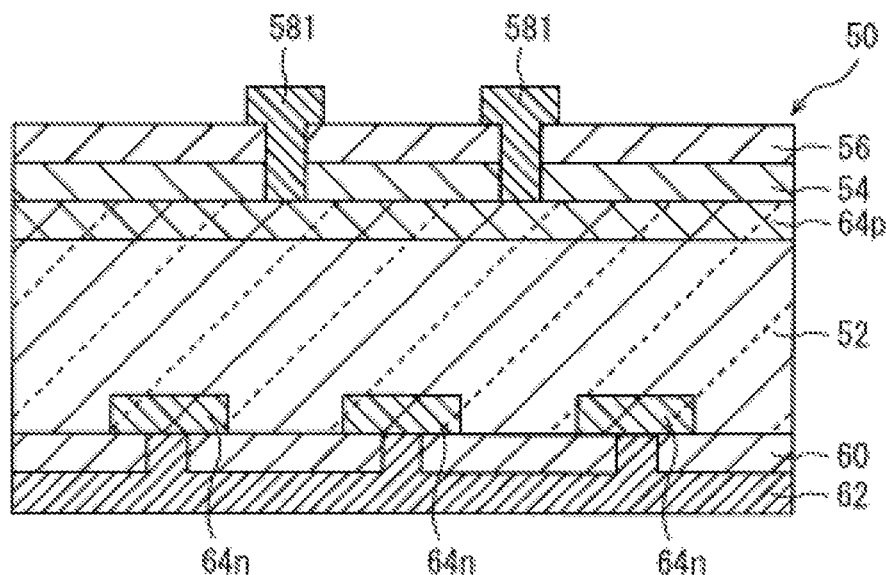
FIG. 16G is a sectional view illustrating the manufacturing method of the photoelectric conversion element illustrated in FIG. 15, and is a sectional view illustrating a state where the electrode is formed.

Next, by performing the heat treatment with respect to the metal films 581 and 621, the electrodes 58 and 62 are formed. The heat treatment is performed similar to the first embodiment. Accordingly, as illustrated in FIG. 16G the photoelectric conversion element 50 is obtained.

Even in the photoelectric conversion element 50, similar to the photoelectric conversion element 10, the element characteristics are improved.

In addition, in the photoelectric conversion element 50, by the p-type diffusion layer 64p provided on the entire front surface of the silicon substrate 52, the depletion layer is formed on the entire light-receiving surface of the silicon substrate 52, and high carrier transmission in the horizontal direction is achieved by the p-type diffusion layer 64p. According to this, it is possible to effectively separate electron-positive hole pair generated by the light. Furthermore, by the non-crystalline film 54 (for example, i-type a-Si:H) provided on the front surface of the silicon substrate 52, it is possible to obtain a high passivation effect. In a case where a-Si:H is used as the non-crystalline film 54, the passivation performance deteriorates due to high temperature processing (for example, 300° C. or higher), but in the photoelectric conversion element 50, the low contact resistance is obtained in a low temperature process at 250° C. or lower.

In addition, the photoelectric conversion element 50 may be provided with the n-type diffusion layer instead of the p-type diffusion layer 64p, and may be provided with the p-type diffusion layer instead of the n-type diffusion layer 64n. In addition, in the photoelectric conversion element 50, the conductive type of the silicon substrate 52 may be the p-type.

Application Example of Second Embodiment

Figure 17:
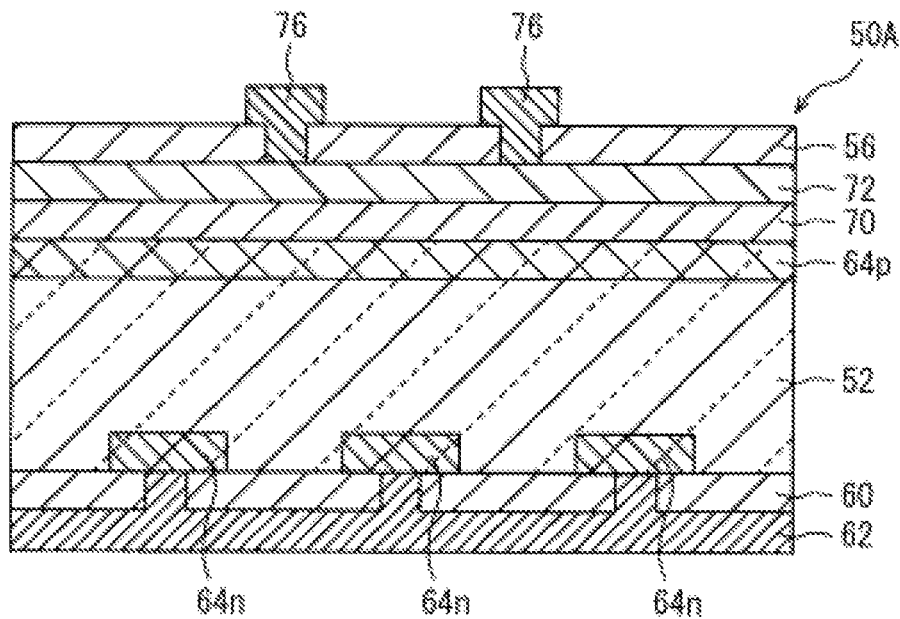
FIG. 17 is a sectional view illustrating a schematic configuration of a photoelectric conversion element according to an application example of the second embodiment of the present invention.

FIG. 17 is a sectional view illustrating a schematic configuration of a photoelectric conversion element 50A according to an application example of the second embodiment. Compared to the photoelectric conversion element 50, instead of the non-crystalline film 54, the photoelectric conversion element 50A is provided with a non-crystalline film 70 and a non-crystalline film 72. In addition, compared to the photoelectric conversion element 50, the photoelectric conversion element 50A is provided with an electrode 76 instead of the electrode 58.

The non-crystalline film 70 includes at least the non-crystalline phase, and is made of a-Si:H, for example. It is preferable that the non-crystalline film 70 is made of the i-type a-Si:H, but may contain p-type impurities having lower concentration than the concentration of the p-type impurities contained in the non-crystalline film 72. The film thickness of the non-crystalline film 70 is, for example, 1 nm to 20 nm. The non-crystalline film 70 is in contact with the p-type diffusion layer 64p of the silicon substrate 50, is disposed on the p-type diffusion layer 64p, and passivates the silicon substrate 52.

The non-crystalline film 72 includes at least non-crystalline phase, and is made of, for example, p-type a-Si:H. The film thickness of the non-crystalline film 72 is, for example, 1 nm to 30 nm. The non-crystalline film 72 is in contact with the non-crystalline film 70, and is disposed on the non-crystalline film 70.

The electrode 76 is made Ag. The electrode 76 penetrates the non-crystalline film 56, is in contact with the non-crystalline film 72, and is disposed on the non-crystalline film 56.

In the photoelectric conversion element 50A, the electrode 76 is not directly in contact with the silicon substrate 52, and the front surface of the silicon substrate 52 is coated with the non-crystalline film 70. Therefore, compared to the photoelectric conversion element 50, excellent passivation characteristics are obtained. As a result, the photoelectric conversion efficiency can be further improved.

A manufacturing method of the photoelectric conversion element 50A may be a method in which a process of forming the non-crystalline film 54 is changed to a process of forming the non-crystalline film 70 and the non-crystalline film 72, and in which a process of forming the electrode 58 is changed to a process of forming the electrode 76, from the manufacturing method of the photoelectric conversion element 50.

In addition, the photoelectric conversion element 50A may not be provided with the non-crystalline film 70. In the photoelectric conversion element 50A, the n-type diffusion layer may be provided instead of the p-type diffusion layer 64p, the p-type diffusion layer may be provided instead of the n-type diffusion layer 64n, and the film made of n-type a-Si:H may be provided instead of the non-crystalline film 72. The conductive type of the silicon substrate 52 may be changed to the p-type.

Third Embodiment

Figure 18:
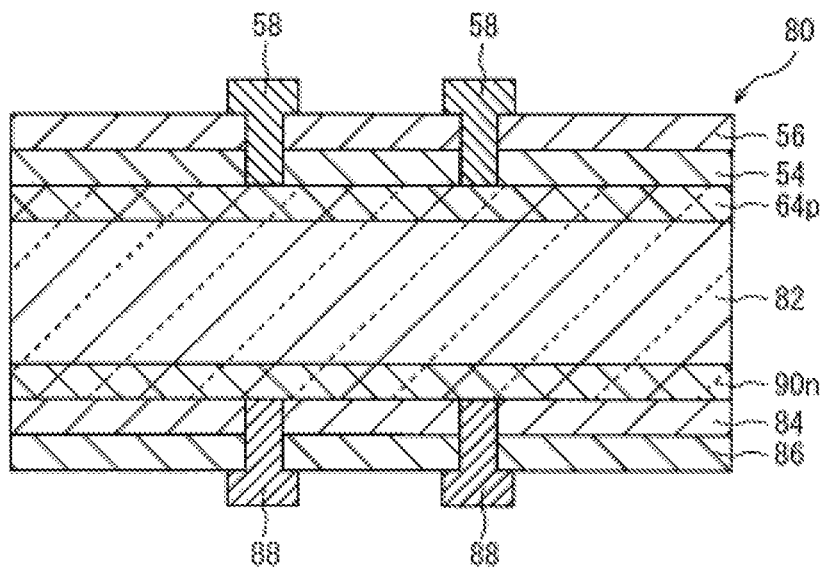
FIG. 18 is a sectional view illustrating a schematic configuration of a photoelectric conversion element according to a third embodiment of the present invention.

FIG. 18 is a sectional view illustrating a schematic configuration of a photoelectric conversion element 80 according to a third embodiment of the present invention. In the photoelectric conversion element 80, a silicon substrate 82 is provided instead of the silicon substrate 52 of the photoelectric conversion element 50, non-crystalline films 84 and 86 are provided instead of the insulation film 60, and an electrode 88 is provided instead of the electrode 62. Other parts are the same as those of the photoelectric conversion element 50.

In the silicon substrate 82, an n-type diffusion layer 90n is provided instead of the n-type diffusion layer 64n of the silicon substrate 52. Other parts are the same as those of the silicon substrate 52.

The n-type diffusion layer 90n is in contact with the entire rear surface opposite to the light-incident side of the silicon substrate 82, and is disposed in the silicon substrate 82. The n-type diffusion layer 90n has the same thickness as that of the n-type diffusion layer 64n, and contains the n-type impurities having the same concentration as that of the n-type impurities of the n-type diffusion layer 64n.

The non-crystalline thin film 84 includes at least the non-crystalline phase, and made of, for example, i-type a-Si:H or n-type a-Si:H. In addition, the film thickness of the non-crystalline thin film 84 is, for example, 1 nm to 20 nm. The non-crystalline thin film 84 is in contact with the rear surface opposite to the light-incident side of the silicon substrate 82, and is disposed on the silicon substrate 82.

The non-crystalline thin film 86 includes at least the non-crystalline phase, and is made of, for example, silicon nitride. In addition, the film thickness of the non-crystalline thin film 86 is, for example, 50 nm to 200 nm.

The electrode 88 is made of Ag. The electrode 88 penetrates the non-crystalline thin films 84 and 86, is in contact with the n-type diffusion layer 90n, and is disposed on the non-crystalline thin film 86.

In the photoelectric conversion element 80, the front surface on the light-incident side of the silicon substrate 82 is passivated by the non-crystalline thin film 54, and the rear surface of the silicon substrate 82 is passivated by the non-crystalline thin film 84. Accordingly, high photoelectric conversion efficiency is obtained. In addition, the light may be incident from the rear surface side of the silicon substrate 82.

[Manufacturing Method of Photoelectric Conversion Element]

With reference to FIGS. 19A to 19F, a manufacturing method of the photoelectric conversion element 80 will be described.

Figure 19A:
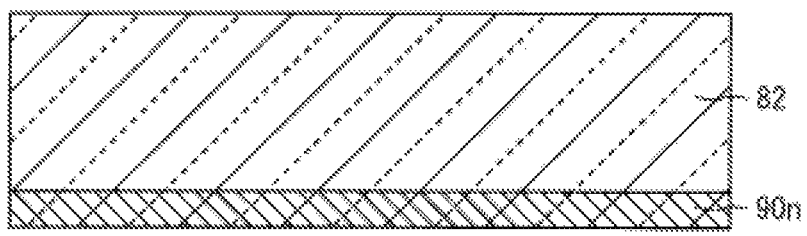
FIG. 19A is a sectional view illustrating a manufacturing method of the photoelectric conversion element illustrated in FIG. 18, and is a sectional view illustrating a state where the n-type diffusion layer is formed on the rear surface side of the silicon substrate.

First, as illustrated in FIG. 19A, the n-type diffusion layer 90n is formed on the silicon substrate 82. Specifically, n-type impurities, such as P and arsenic (As), are ion-injected into the silicon substrate 82, and the n-type diffusion layer 90n is formed on the rear surface side of the silicon substrate 82. In addition, after the ion injection, the heat treatment may be performed for electrically vitalizing the n-type impurities. Instead of the ion injection method, a gas phase diffusion method, a solid phase diffusion method, a plasma doping method, or an ion doping method, may be used.

Figure 19B:
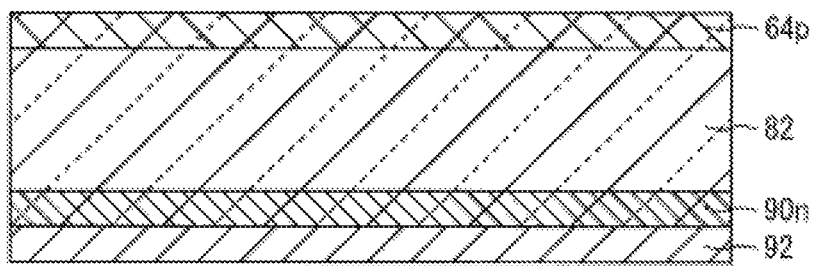
FIG. 19B is a sectional view illustrating the manufacturing method of the photoelectric conversion element illustrated in FIG. 18, and is a sectional view illustrating a state where the p-type diffusion layer is formed on the front surface side of the silicon substrate.

Next, as illustrated in FIG. 19B, the p-type diffusion layer 64p is formed on the silicon substrate 82. Specifically, p-type impurities, such as B, gallium (Ga), or indium (In), are ion-injected into the silicon substrate 82 from the light-incident side. Accordingly, the p-type diffusion layer 64p is formed on the light-incident side of the silicon substrate 82. In addition, after the ion injection, the heat treatment may be performed for electrically vitalizing the p-type impurities.

Figure 19C:
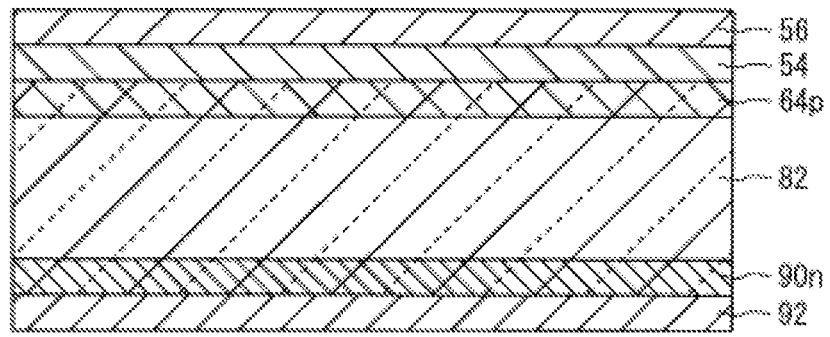
FIG. 19C is a sectional view illustrating the manufacturing method of the photoelectric conversion element illustrated in FIG. 18, and is a sectional view illustrating a state where the non-crystalline film is formed on the front surface of the silicon substrate.

Next, as illustrated in FIG. 19C, the non-crystalline films 54 and 56 are formed on the light-receiving surface of the silicon substrate 82. The non-crystalline films 54 and 56 are formed, for example, by the plasma CVD.

Figure 19D:
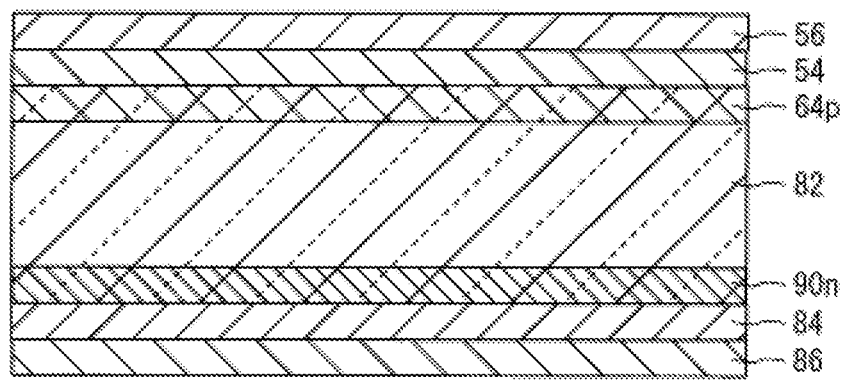
FIG. 19D is a sectional view illustrating the manufacturing method of the photoelectric conversion element illustrated in FIG. 18, and is a sectional view illustrating a state where the non-crystalline film is formed on the rear surface of the silicon substrate.

Next, as illustrated in FIG. 19D, the non-crystalline thin films 84 and 86 are layered in order on the rear surface of the silicon substrate 82. The non-crystalline thin films 84 and 86 are formed, for example, by the plasma CVD.

Figure 19E:
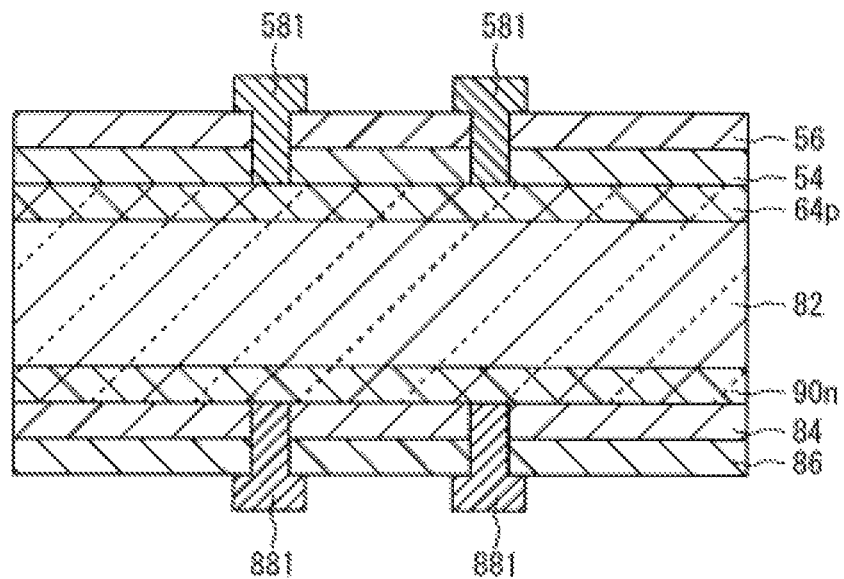
FIG. 19E is a sectional view illustrating the manufacturing method of the photoelectric conversion element illustrated in FIG. 18, and is a sectional view illustrating a state where the metal film is formed.

Next, as illustrated in FIG. 19E, the metal films 581 and 881 are formed. A manufacturing method of the metal films 581 and 881 is, for example, as follows.

First, the entire surface of the non-crystalline film 56 is coated with the resist. Next, the resist is patterned by the photolithography method, and the resist pattern is formed. Next, by using a photoresist as a mask, etching is performed with respect to a part of the non-crystalline film 56 and the non-crystalline film 54. Next, resist pattern is removed. Accordingly, a part of the p-type diffusion layer 64p is exposed. Next, by using the deposition method or the sputtering method, the metal film made of Ag is formed on the entire surface of the non-crystalline film 56. Next, the metal film is patterned. Accordingly, the metal film 581 is formed.

Next, the entire surface of the non-crystalline film 86 is coated with the resist. Next, the resist is patterned by the photolithography method, and the resist pattern is formed. Next, by using the resist pattern as a mask, the etching is performed with respect to a part of the non-crystalline film 86, and the resist pattern is removed. Accordingly, a part of the n-type diffusion layer 64n of the silicon substrate 82 is exposed.

Next, by using the deposition method and the sputtering method, the metal film 881 made of Ag is formed to cover the non-crystalline thin film 86.

Figure 19F:
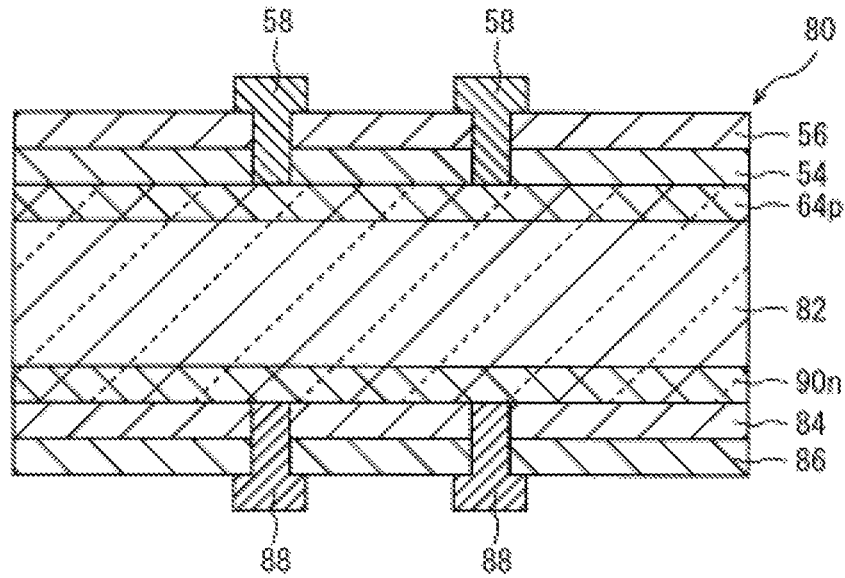
FIG. 19F is a sectional view illustrating the manufacturing method of the photoelectric conversion element illustrated in FIG. 18, and is a sectional view illustrating a state where the electrode is formed.

Next, by performing the heat treatment with respect to the metal films 581 and 881, the electrodes 58 and 88 are formed. The heat treatment is performed similar to the first embodiment. Accordingly, as illustrated in FIG. 19F, the photoelectric conversion element 80 is obtained.

Even in the photoelectric conversion element 80, similar to the photoelectric conversion element 10, the element characteristics are improved.

In addition, in the photoelectric conversion element 80, the n-type diffusion layer may be provided instead of the p-type diffusion layer 64p, and the p-type diffusion layer may be provided instead of the n-type diffusion layer 90n. In this case, the non-crystalline thin film 54 is made of i-type a-Si:H or n-type a-Si:H, and the non-crystalline thin film 84 is made of i-type a-Si:H or p-type a-Si:H.

Application Example 1 of Third Embodiment

Figure 20:
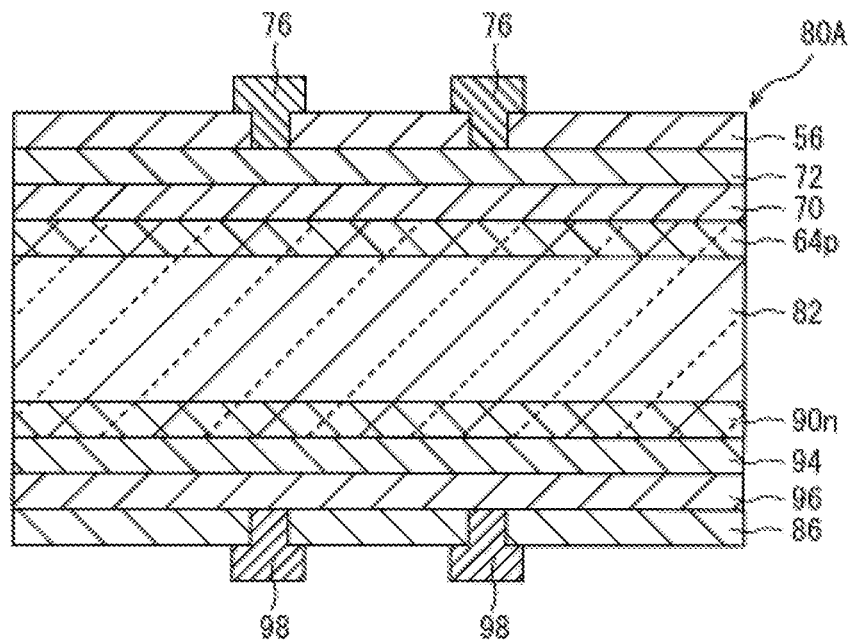
FIG. 20 is a sectional view illustrating a schematic configuration of the photoelectric conversion element according to an application example 1 of the third embodiment of the present invention.

FIG. 20 is a vertically sectional view illustrating a schematic configuration of a photoelectric conversion element 80A according to an application example 1 of the third embodiment. Compared to the photoelectric conversion element 80, the photoelectric conversion element 80A is provided with the non-crystalline film 70 and the non-crystalline film 72 instead of the non-crystalline film 54. Instead of the non-crystalline film 84, a non-crystalline film 94 and a non-crystalline film 96 are provided. Instead of the electrode 58, the electrode 76 is provided. Instead of the electrode 88, an electrode 98 is provided.

The non-crystalline thin film 94 includes at least the non-crystalline phase, and is made of, for example, i-type a-Si:H or n-type a-Si:H. The non-crystalline thin film 94 is in contact with the rear surface of the silicon substrate 82, and is disposed on the rear surface of the silicon substrate 82.

The non-crystalline thin film 96 includes at least the non-crystalline phase, and is made of, for example, n-type a-Si:H. The non-crystalline thin film 96 is in contact with the non-crystalline film 94, and is disposed on non-crystalline thin film 941.

The electrode 98 is made of Ag. The electrode 98 penetrates the non-crystalline thin film 86, is in contact with the non-crystalline thin film 96, and is disposed on the non-crystalline thin film 86.

A manufacturing method of the photoelectric conversion element 80A may be a method in which a process of forming the non-crystalline film 54 is changed to a process of forming the non-crystalline film 70 and the non-crystalline film 72, a process of forming the non-crystalline film 84 is changed to a process of forming the non-crystalline film 94 and the non-crystalline film 96, a process of forming the electrode 58 is changed to a process of forming the electrode 76, and a process of forming the electrode 88 is changed to a process of forming the electrode 98, from the manufacturing method of the photoelectric conversion element 80.

In the configurations of the photoelectric conversion element 80A, the non-crystalline films 70 and 72 are formed between the electrode 76 and the silicon substrate 82, and the non-crystalline films 94 and 96 are formed between the electrode 98 and the silicon substrate 82. Therefore, compared to the photoelectric conversion element 80, a higher passivation effect is obtained.

In addition, the photoelectric conversion element 80A may not be provided with the non-crystalline films 70 and 94. In the photoelectric conversion element 80A, the n-type diffusion layer may be provided instead of the p-type diffusion layer 64p, the p-type diffusion layer may be provided instead of the n-type diffusion layer 90n, a film made of n-type a-Si:H may be provided instead of the non-crystalline film 72, and a film made of p-type a-Si:H may be provided instead of the non-crystalline film 96. The conductive type of the silicon substrate 82 may be changed to the p-type.

Application Example 2 of Third Embodiment

Figure 21:
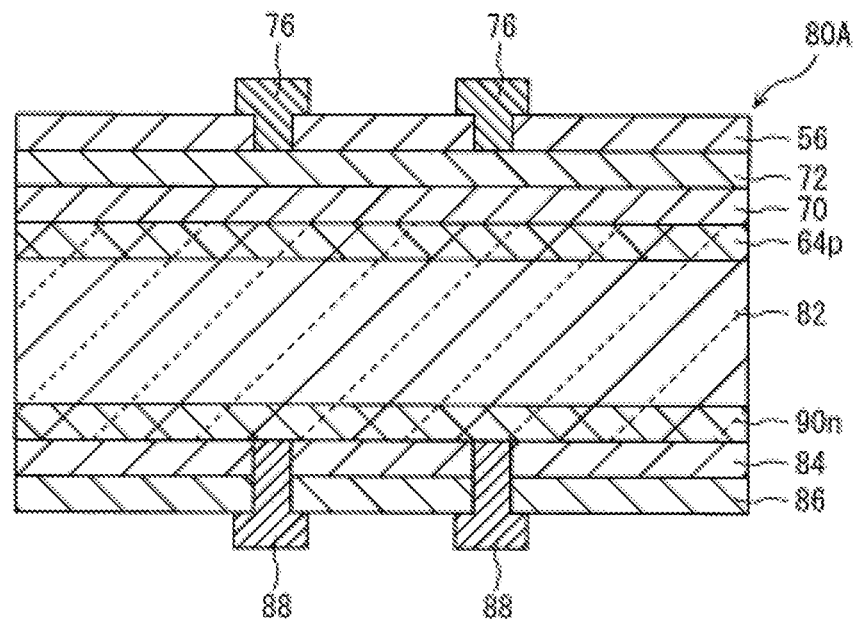
FIG. 21 is a sectional view illustrating a schematic configuration of a photoelectric conversion element according to an application example 2 of the third embodiment of the present invention.

FIG. 21 is a vertically sectional view illustrating a schematic configuration of a photoelectric conversion element 80B according to an application example 2 of the third embodiment. Compared to the photoelectric conversion element 80, instead of the non-crystalline film 54, the photoelectric conversion element 80B is provided with the non-crystalline film 70 and the non-crystalline film 72. Instead of the electrode 58, the electrode 76 is provided.

A manufacturing method of the photoelectric conversion element 80B may be a method in which a process of forming the non-crystalline film 54 is changed to a process of forming the non-crystalline film 70 and the non-crystalline film 72, and a process of forming the electrode 58 is changed to a process of forming the electrode 76, from the manufacturing method of the photoelectric conversion element 80.

In addition, the photoelectric conversion element 80B may not be provided with the non-crystalline film 70. In the photoelectric conversion element 80B, the n-type diffusion layer may be provided instead of the p-type diffusion layer 64p, the p-type diffusion layer may be provided instead of the n-type diffusion layer 90n, and a film made of n-type a-Si:H may be provided instead of the non-crystalline film 72. The conductive type of the silicon substrate 82 may be changed to the p-type.

Fourth Embodiment

Figure 22:
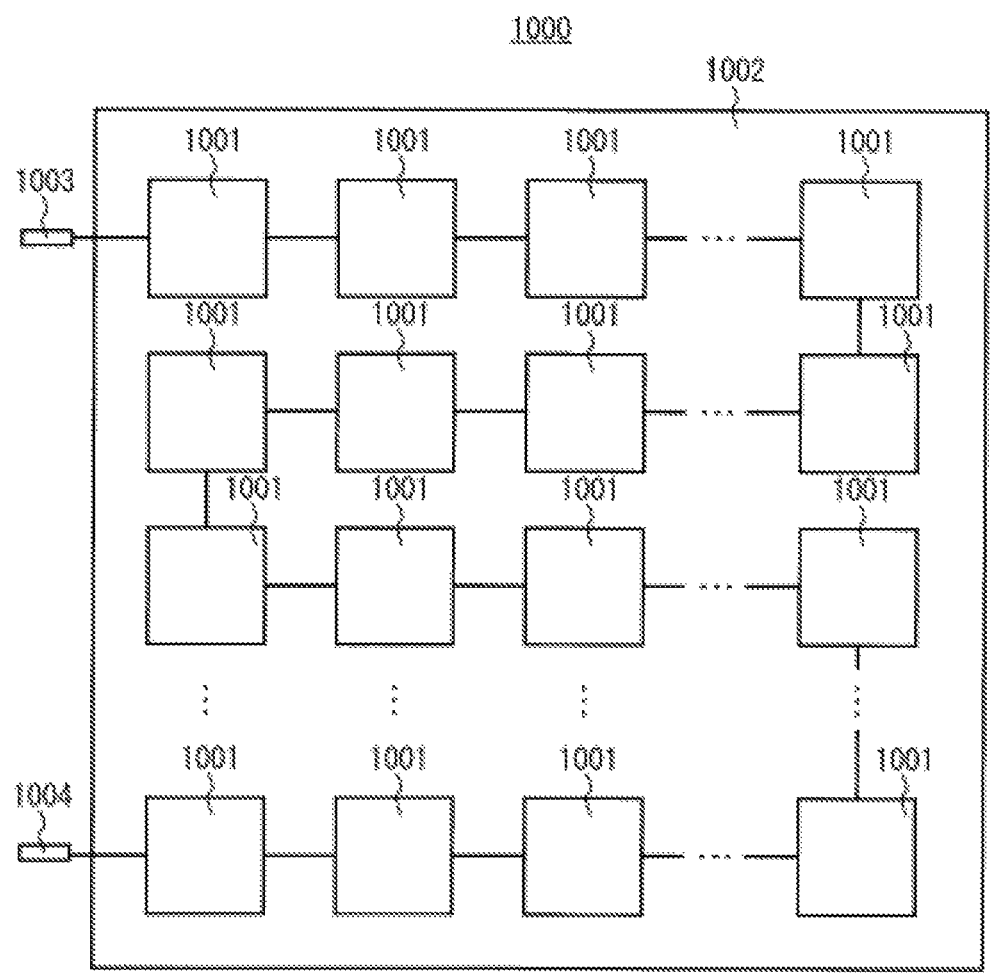
FIG. 22 is a schematic view illustrating a configuration of a photoelectric conversion module provided with the photoelectric conversion element according to the embodiment.

FIG. 22 is a sectional view illustrating a schematic configuration of a photoelectric conversion module provided with the photoelectric conversion element according to the embodiment. With reference to FIG. 22, a photoelectric conversion module 1000 includes a plurality of photoelectric conversion elements 1001, a cover 1002, output terminals 1003 and 1004.

The plurality of photoelectric conversion elements 1001 are disposed in a shape of an array, and are connected to each other in series. Instead of being connected to each other in series, parallel connection or connection in which the series connection and the parallel connection are combined, may be employed. Each of the plurality of photoelectric conversion elements 1001 is made of any of the photoelectric conversion elements 10, 10A, 10B, 10C, 50, 50A, 80, 80A, and 80B.

The cover 1002 is made of pollution-resistant cover, and covers the plurality of photoelectric conversion elements 1001.

The output terminal 1003 is connected to the photoelectric conversion element 1001 disposed at one end among the plurality of photoelectric conversion elements 1001 that are connected to each other in series.

The output terminal 1004 is connected to the photoelectric conversion element 1001 disposed at the other end among the plurality of photoelectric conversion elements 1001 that are connected to each other in series.

As described above, the characteristics of the photoelectric conversion elements 10, 10A, 10B, 10C, 50, 50A, 80, 80A, and 80B, are improved. Therefore, the performance of the photoelectric conversion module 1000 can be improved.

In addition, not being limited to the configuration illustrated in FIG. 22, the photoelectric conversion module according to the fourth embodiment may be configured in any manner as long as any of the photoelectric conversion elements 10, 10A, 10B, 10C, 50, 50A, 80, 80A, and 80B is used.

Fifth Embodiment

Figure 23:
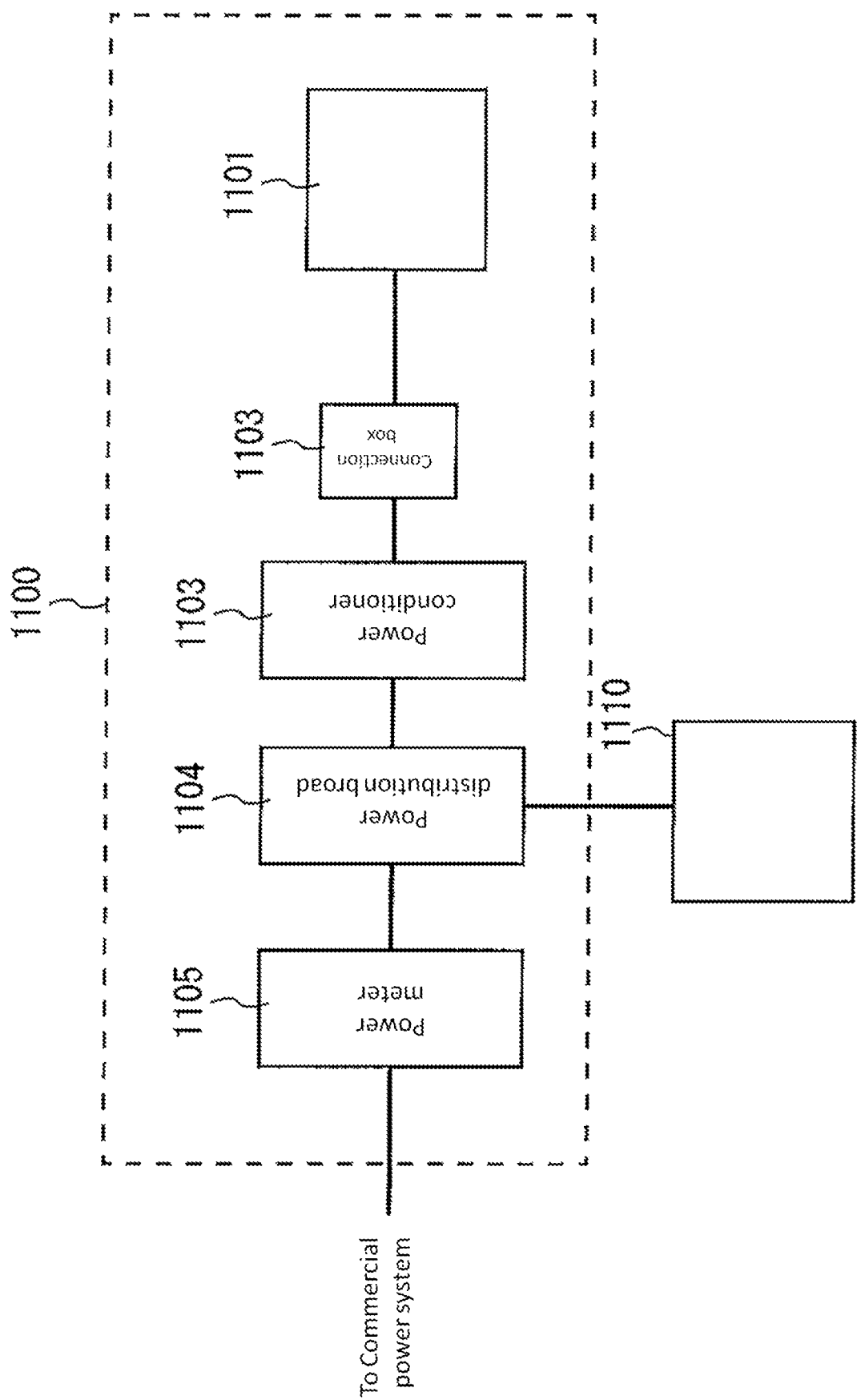
FIG. 23 is a schematic view illustrating a configuration of a solar photovoltaic power generation system provided with the photoelectric conversion element according to the embodiment.

FIG. 23 is a schematic view illustrating a configuration of a solar photovoltaic power generation system provided with the photoelectric conversion element according to the embodiment. With reference to FIG. 23, a solar photovoltaic power generation system 1100 includes a photoelectric conversion module array 1101, a connection box 1102, a power conditioner 1103, a distribution board 1104, and a power meter 1105.

The connection box 1102 is connected to the photoelectric conversion module array 1101. The power conditioner 1103 is connected to the connection box 1102. The distribution board 1104 is connected to the power conditioner 1103 and an electrical machine 1110. The power meter 1105 is connected to the distribution board 1104 and a commercial power system.

The photoelectric conversion module array 1101 converts sunlight into electricity, generates DC power, and supplies the generated DC power to the connection box 1102.

The connection box 1102 receives the DC power generated by the photoelectric conversion module array 1101, and supplies the received DC power to the power conditioner 1103.

The power conditioner 1103 converts the DC power received from the connection box 1102 into AC power, and supplies the converted AC power to the distribution board 1104.

The distribution board 1104 supplies the AC power received from the power conditioner 1103, and/or commercial power received via the power meter 1105, to the electrical machine 1110. In addition, when the AC power received from the power conditioner 1103 is greater than power consumption of the electrical machine 1110, the distribution board 1104 supplies residual AC power to the commercial power system via the power meter 1105.

The power meter 1105 measures the power in the direction toward the distribution board 1104 from the commercial power system, and measures the power in the direction toward the commercial power system from the distribution board 1104.

Figure 24:
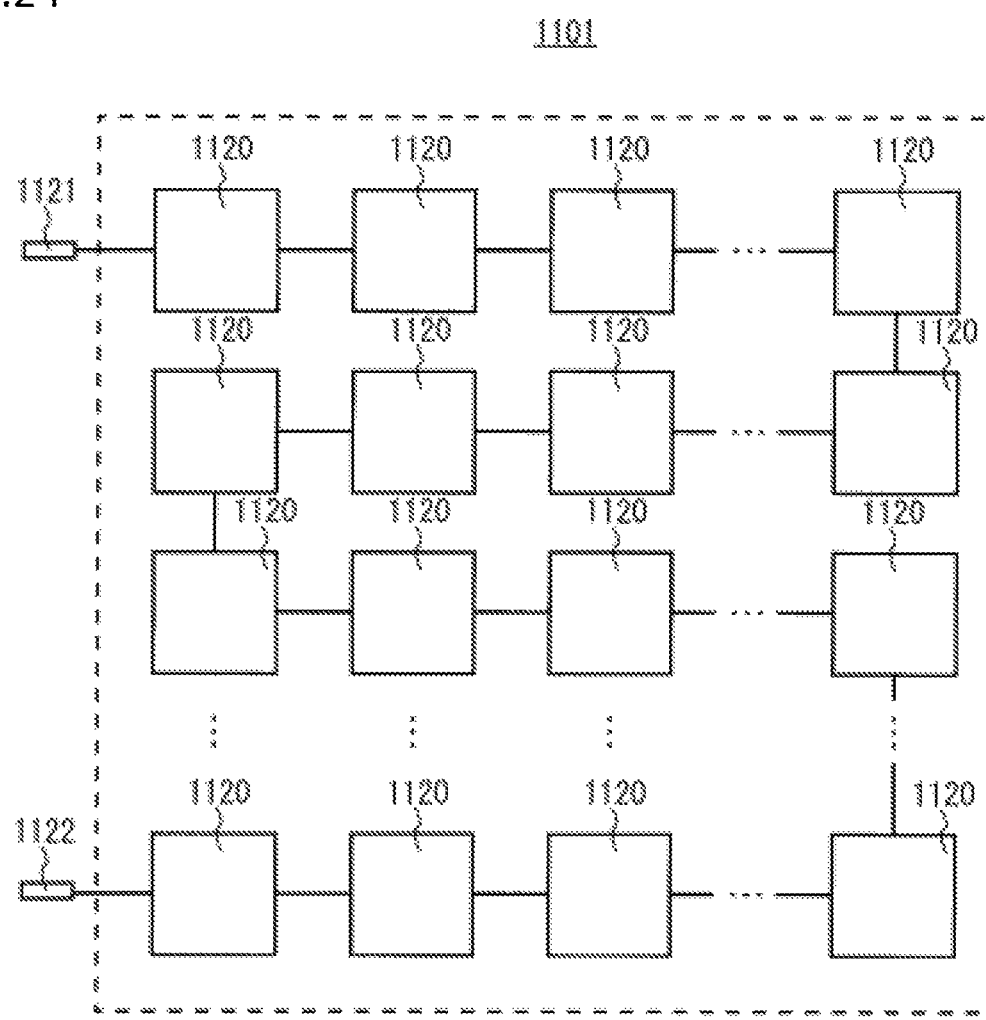
FIG. 24 is a schematic view illustrating a configuration of a photoelectric conversion module array illustrated in FIG. 23.

FIG. 24 is a schematic view illustrating a configuration of the photoelectric conversion module array 1101 illustrated in FIG. 23. With reference to FIG. 24, the photoelectric conversion module array 1101 includes a plurality of photoelectric conversion modules 1120 and output terminals 1121 and 1122.

The plurality of photoelectric conversion modules 1120 are disposed in a shape of an array, and are connected to each other in series. Instead of being connected to each other in series, parallel connection or connection in which the series connection and the parallel connection are combined, may be employed. Each of the plurality of photoelectric conversion modules 1120 is made of the photoelectric conversion module 1000 illustrated in FIG. 22.

The output terminal 1121 is connected to the photoelectric conversion module 1120 which is positioned at one end among the plurality of photoelectric conversion modules 1120 that are connected to each other in series.

The output terminal 1122 is connected to the photoelectric conversion module 1120 which is positioned at the other end among the plurality of photoelectric conversion modules 1120 that are connected to each other in series.

An operation in the solar photovoltaic power generation system 1100 will be described. The photoelectric conversion module array 1101 converts the sunlight into electricity, generates the DC power, and supplies the generated DC power to the power conditioner 1103 via the connection box 1102.

The power conditioner 1103 converts the DC power received from the photoelectric conversion module array 1101 into the AC power, and supplies the converted AC power to the distribution board 1104.

When the AC power received from the power conditioner 1103 is equal to or greater than the power consumption of the electrical machine 1110, the distribution board 1104 supplies the AC power received from the power conditioner 1103 to the electrical machine 1110. In addition, the distribution board 1104 supplies the residual AC power to the commercial power system via the power meter 1105.

In addition, when the AC power received from the power conditioner 1103 is less than the power consumption of the electrical machine 1110, the distribution board 1104 supplies the AC power received from the commercial power system and the AC power received from the power conditioner 1103, to the electrical machine 1110.

As described above, the solar photovoltaic power generation system 1100 is provided with any of the photoelectric conversion elements 10, 10A, 10B, 10C, 50, 50A, 80, 80A, and 80B in which the element characteristics are improved. Therefore, performance of the solar photovoltaic power generation system 1100 can be improved.

In addition, not being limited to configurations illustrated in FIGS. 23 and 24, the solar photovoltaic power generation system according to the fifth embodiment may be configured in any manner as long as any of the photoelectric conversion elements 10, 10A, 10B, 10C, 50, 50A, 80, 80A, and 80B, is used.

Sixth Embodiment

Figure 25:
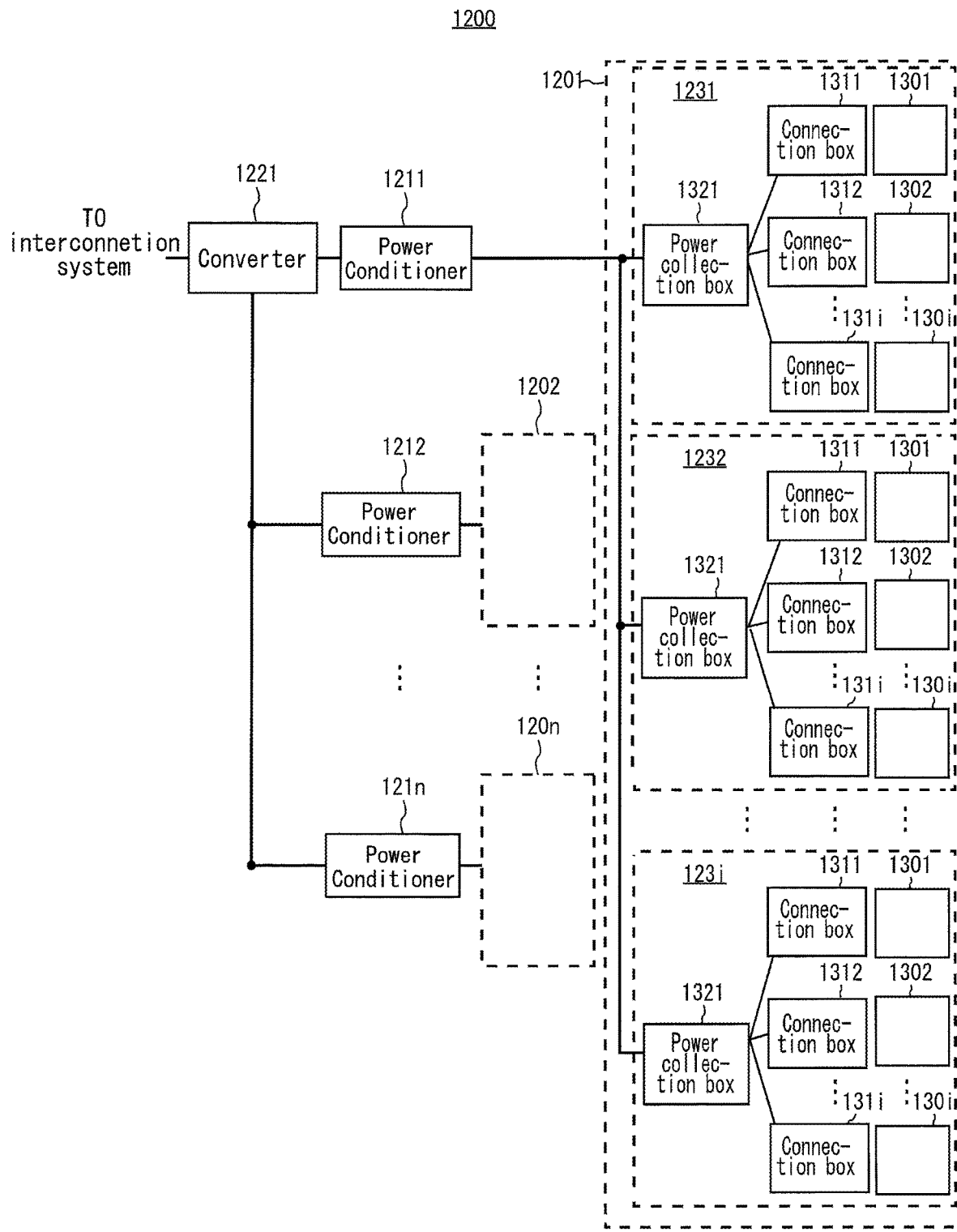
FIG. 25 is a schematic view illustrating a configuration of the solar photovoltaic power generation system provided with the photoelectric conversion element according to the embodiment.

FIG. 25 is a schematic view illustrating a configuration of the solar photovoltaic power generation system provided with the photoelectric conversion element according to the embodiment. With reference to FIG. 25, a solar photovoltaic power generation system 1200 includes subsystems 1201 to 120n (n is an integer which is equal to or greater than 2), power conditioners 1211 to 121n, and a converter 1221. The solar photovoltaic power generation system 1200 is a solar photovoltaic power generation system of which the dimension is greater than that of the solar photovoltaic power generation system 1100 illustrated in FIG. 23.

The power conditioners 1211 to 121n are respectively connected to the subsystems 1201 to 120n.

The converter 1221 is connected to the power conditioners 1211 to 121n and the commercial power system.

Each of the subsystems 1201 to 120n is made of module systems 1231 to 123j (j is an integer which is equal to or greater than 2).

Each of the module systems 1231 to 123j includes photoelectric conversion module arrays 1301 to 130i (i is an integer which is equal to or greater than 2), connection boxes 1311 to 131i, and a power collection box 1321.

Each of the photoelectric conversion module arrays 1301 to 130i is configured the same as the photoelectric conversion module array 1101 illustrated in FIG. 34.

The connection boxes 1311 to 131i are respectively connected to the photoelectric conversion module arrays 1301 to 130i.

The power collection box 1321 is connected to the connection boxes 1311 to 131i. In addition, j power collection boxes 1321 of the subsystem 1201 are connected to the power conditioner 1211. j power collection boxes 1321 of the subsystem 1202 are connected to the power conditioner 1212. Hereinafter, similarly, j power collection boxes 1321 of the subsystem 120n are connected to the power conditioner 121n.

i photoelectric conversion module arrays 1301 to 130i of the module system 1231 convert the sunlight into electricity, generate the DC power, and supply the generated DC power to the power collection box 1321 via each of the connection boxes 1311 to 131i. i photoelectric conversion module arrays 1301 to 130i of the 1232 convert the sunlight into electricity, generate the DC power, and supply the generated DC power to the power collection box 1321 via each of the connection boxes 1311 to 131i. Hereinafter, similarly, i photoelectric conversion module arrays 1301 to 130i of the module system 123j convert the sunlight into electricity, generate the DC power, and supply the generated DC power to the power collection box 1321 via each of the connection boxes 1311 to 131i.

In addition, j power collection boxes 1321 of the subsystem 1201 supply the DC power to the power conditioner 1211. j power collection boxes 1321 of the subsystem 1202 similarly supply the DC power to the power conditioner 1212.

Hereinafter, similarly, j power collection boxes 1321 of the subsystem 120n supply the DC power to the power conditioner 121n.

The power conditioners 1211 to 121n respectively convert the DC power received from the subsystems 1201 to 120n to the AC power, and supply the converted AC power to the converter 1221.

The converter 1221 receives the AC power from the power conditioners 1211 to 121n, converts a voltage level of the received AC power, and supplies the power to the commercial power system.

As described above, the solar photovoltaic power generation system 1200 is provided with any of the photoelectric conversion elements 10, 10A, 10B, 10C, 50, 50A, 80, 80A, and 80B in which the element characteristics are improved. Therefore, the performance of the solar photovoltaic power generation system 1200 can be improved. In addition, not being limited to configurations illustrated in FIG. 25, the solar photovoltaic power generation system according to the sixth embodiment may be configured in any manner as long as any of the photoelectric conversion elements 10, 10A, 10B, 10C, 50, 50A, 80, 80A, and 80B, is used.

Above, the embodiments of the present invention are described in detail, but the description is merely an example, but the description is merely an example, and the present invention is not limited to the above-described embodiments.

For example, in the first embodiment, the silicon substrate 12 may be the p-type single crystal silicon substrate. In this case, it is preferable that the width dimension of the p-type non-crystalline silicon layer 20p becomes smaller than the width dimension of the n-type non-crystalline silicon layer 20n in the in-surface direction of the silicon substrate 12. This is similar in the application examples 1 to 3.

In the first embodiment, the texture structure on the light-receiving surface side of the silicon substrate 12, and the texture structure of the rear surface side, are not necessary configuration elements. This is similar in the application examples 1 to 3.

In the first embodiment, the passivation film 14 and the reflection preventing film 16 are not necessary configuration elements. This is similar in the application examples 1 to 3.

In the first embodiment, the high concentration region may be formed on the light-receiving surface side of the silicon substrate 12. The high concentration region is a region in which the impurities having the same conductive type as the silicon substrate 12 are doped to higher concentration than the silicon substrate 12. The high concentration region functions as a front surface field (FSF). This is similar in the application examples 1 to 3.

What is claimed is:

1. A photoelectric conversion element comprising:
   a semiconductor substrate;
   a first non-crystalline semiconductor layer having a first conductive type;
   a second non-crystalline semiconductor layer having a second conductive type opposite to the first conductive type;
   a first electrode which is in direct contact with the first non-crystalline semiconductor layer; and
   a second electrode which is in contact with the second non-crystalline semiconductor layer,
   wherein the first electrode includes a plurality of metal crystal grains,
   wherein an average crystal grain size of the plurality of metal crystal grains in an in-surface direction of the first electrode is greater than a thickness of the first electrode, and
   wherein the first electrode is made of a metal film which has silver as a main component,
   wherein, the plurality of metal crystal grains includes metal crystal grains oriented in a <110> direction, metal crystal grains oriented in a <100> direction, and metal crystal grains oriented in a <111> direction,
   wherein each of the <100> direction, the <110> direction, and the <111> direction is within 10 degrees with respect to a thickness direction of the semiconductor substrate, and
   wherein an area of the plurality of metal crystal grains oriented in the <111> direction is greater than an area of the plurality of metal crystal grains oriented in the <100> direction and an area of the plurality of metal crystal grains oriented in the <110> direction.

2. The photoelectric conversion element according to claim 1, wherein the first non-crystalline semiconductor layer and the second non-crystalline semiconductor layer are provided on a rear surface opposite to a light-receiving surface on the semiconductor substrate.

3. The photoelectric conversion element according to claim 1,
   wherein the first conductive type is an n-type.

4. The photoelectric conversion element according to claim 1,
   wherein the first conductive type is an n-type, and
   wherein the average crystal grain size is greater than or equal to 1.54 times the thickness of the first electrode.

5. The photoelectric conversion element according to claim 1,
   wherein the second conductive type is a p-type, and
   wherein the average crystal grain size is greater than 1.5 times and less than or equal to 2.44 times a thickness of the second electrode.

6. The photoelectric conversion element according to claim 1,
   wherein the second conductive type is a p-type, and
   wherein the average crystal grain size is greater than 1.26 times and less than or equal to 2.44 times a thickness of the second electrode.

7. The photoelectric conversion element according to claim 1,
   wherein the semiconductor substrate is the first conductive type,
   wherein a contact area between the second electrode and the second non-crystalline semiconductor layer is 2 times or greater than a contact area between the first electrode and the first non-crystalline semiconductor layer, and
   wherein an average value of the average crystal grain size of the first electrode and an average crystal grain size of the second electrode is greater than 1.5 times and less than or equal to 4.72 times the thickness of the first electrode and the second electrode.

8. The photoelectric conversion element according to claim 1,
   wherein the semiconductor substrate is the first conductive type,
   wherein a contact area between the second electrode and the second non-crystalline semiconductor layer is greater than or equal to 1 time a contact area between the first electrode and the first non-crystalline semiconductor layer, and
   wherein an average value of the average crystal grain size of the first electrode and an average crystal grain size of the second electrode is greater than 1.5 times and less than or equal to 4 times the thickness of the first electrode and the second electrode.

9. A photoelectric conversion module comprising;
   at least one photoelectric conversion element according to claim 1.

10. The solar photovoltaic power generation system comprising;
    at least one photoelectric conversion element according to claim 1.

* * * * *